US008803151B2

(12) United States Patent
Okajima et al.

(10) Patent No.: US 8,803,151 B2
(45) Date of Patent: Aug. 12, 2014

(54) SEMICONDUCTOR DEVICE

(75) Inventors: Nami Okajima, Osaka (JP); Masahiro Fujiwara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 158 days.

(21) Appl. No.: 13/641,186

(22) PCT Filed: Apr. 15, 2011

(86) PCT No.: PCT/JP2011/059410
§ 371 (c)(1),
(2), (4) Date: Oct. 24, 2012

(87) PCT Pub. No.: WO2011/129441
PCT Pub. Date: Oct. 20, 2011

(65) Prior Publication Data
US 2013/0037815 A1 Feb. 14, 2013

(30) Foreign Application Priority Data

Apr. 16, 2010 (JP) .................................. 2010-095136

(51) Int. Cl.
*H01L 29/04* (2006.01)
*H01L 29/10* (2006.01)
*G02F 1/1368* (2006.01)
*H01L 27/146* (2006.01)
*G06F 3/042* (2006.01)
*G02F 1/1333* (2006.01)

(52) U.S. Cl.
CPC ...... *H01L 27/14678* (2013.01); *G02F 1/13338* (2013.01); *G02F 1/1368* (2013.01); *G06F 3/042* (2013.01); *H01L 27/14645* (2013.01)
USPC .............................................. 257/59; 257/72

(58) Field of Classification Search
CPC .................. H01L 27/14678; H01L 27/14645; G02F 1/13338; G02F 1/1368; G02F 3/042

USPC ..................................................... 257/59, 72
See application file for complete search history.

(56) References Cited

U.S. PATENT DOCUMENTS 8,045,081 B2* 10/2011 Lee et al. ......................... 349/43
8,299,471 B2* 10/2012 Liu et al. .......................... 257/72
(Continued)

FOREIGN PATENT DOCUMENTS

| JP | 2003-240861 A | 8/2003 |
|---|---|---|
| JP | 2005-259780 A | 9/2005 |

(Continued)

OTHER PUBLICATIONS

English translation of Official Communication issued in corresponding International Application PCT/JP2011/059410, mailed on Nov. 15, 2012.

(Continued)

*Primary Examiner* — Hung Vu
(74) *Attorney, Agent, or Firm* — Keating & Bennett, LLP

(57) ABSTRACT

A semiconductor device (100) includes: a first thin film transistor (105) of a first conductivity type formed on a substrate for each pixel; and a plurality of photosensor sections (200). Each photosensor section (200) includes a photodetecting portion including a thin film diode (202), a capacitor (206) for storing a photocurrent occurring in the thin film diode (202), and a second thin film transistor (204) of the first conductivity type, the photodetecting portion being connected to the capacitor (206) via the second thin film transistor (204); the first and second thin film transistors (105, 204) and the thin film diode (202) have semiconductor layers made of the same semiconductor film; and a characteristic of the first thin film transistor (105) and a characteristic of the second thin film transistor (204) are different. As a result, the characteristics of the thin film transistors for use in the pixels and the thin film transistors for use in the photosensor sections can be controlled in accordance with the characteristics required of the respective thin film transistors.

19 Claims, 9 Drawing Sheets

(56) References Cited

U.S. PATENT DOCUMENTS

| | | |
|---|---|---|
| 8,344,381 B2 * | 1/2013 | Cho et al. ............... 257/59 |
| 2003/0155517 A1 | 8/2003 | Numai et al. |
| 2010/0065851 A1 | 3/2010 | Makita |
| 2011/0073918 A1 | 3/2011 | Makita |
| 2011/0175535 A1 | 7/2011 | Makita |
| 2012/0176356 A1 | 7/2012 | Usukura et al. |
| 2012/0176357 A1 | 7/2012 | Katoh et al. |
| 2012/0268439 A1 | 10/2012 | Yamamoto et al. |

FOREIGN PATENT DOCUMENTS

| | | |
|---|---|---|
| JP | 2005-275644 A | 10/2005 |
| JP | 2007-072242 A | 3/2007 |
| JP | 2009-010125 A | 1/2009 |
| JP | 2010-177362 A | 8/2010 |
| JP | 2011-076023 A | 4/2011 |
| WO | 2008/132862 A1 | 11/2008 |
| WO | 2009/144915 A1 | 12/2009 |
| WO | 2010/038419 A1 | 4/2010 |
| WO | 2011/040090 A1 | 4/2011 |
| WO | 2011/040091 A1 | 4/2011 |
| WO | 2011/040093 A1 | 4/2011 |

OTHER PUBLICATIONS

Official Communication issued in International Patent Application No. PCT/JP2011/059410, mailed on Jul. 19, 2011.

* cited by examiner

SEMICONDUCTOR DEVICE

TECHNICAL FIELD

The present invention relates to a semiconductor device having a photosensor section which includes a thin film diode (TFD).

BACKGROUND ART

In recent years, electronic appliances having a photosensor section utilizing a TFD, e.g., display devices and image sensors, are being developed.

For example, Patent Document 1 proposes forming semiconductor layers of a TFD and a thin film transistor (Thin Film Transistor: TFT), which are of different crystal states, from the same amorphous semiconductor film. Such a TFD and TFT are applicable to a display device having an optical touch-screen panel, for example.

In such a display device, TFTs are provided for respective pixels in a display region, and used as pixel switching elements (pixel TFT). Moreover, they are also provided in a frame region that is located around the display region, and used as driving circuit TFTs composing a driving circuit. On the other hand, TFDs are used as photodetection devices. For example, by providing photosensor sections including TFDs in the display region, it becomes possible to detect an object, such as a finger touching the screen, by utilizing external light.

Patent Document 2 proposes, in a display device having an optical touch-screen panel, performing sensing by using an invisible light beam which is emitted from a backlight, where sensors for detecting the invisible light beam are used. In the display device disclosed in Patent Document 2, an invisible light beam which is emitted from a backlight and is reflected from an object such as a finger touching the screen is detected by sensors which are provided in the respective pixels of the display device.

FIG. 11 is a circuit diagram showing the construction of a photosensor section which is disclosed in Patent Document 1. The photosensor section includes a thin film diode for use as a photosensor (hereinafter, a "photosensor TFD") 701, a condenser 702 for signal storage, and a thin film transistor (hereinafter, a "buffer TFT") 703 for allowing a signal stored in the condenser 702 to be taken out with amplification. After an RST signal comes in and an RST potential is written to a node 704, if the potential of the node 704 lowers due to leakage caused by light, the gate potential of the buffer TFT 703 will fluctuate, thereby causing the TFT gate to open or close. As a result of this, a signal VDD can be taken out.

CITATION LIST

Patent Literature

[Patent Document 1] International Publication No. 2008/132862
[Patent Document 2] Japanese Laid-Open Patent Publication No. 2005-275644

SUMMARY OF INVENTION

Technical Problem

The photosensor section allows a photocurrent occurring in the photosensor TFD to be stored in the capacitor (condenser), where it is retained for a certain period. In Japanese Patent Application No. 2009-230222 (yet to be published), for example, the Applicants have proposed a construction in which a switching transistor (hereinafter, a "retention TFT") is provided between a photosensor thin film diode and a capacitor in order to control retention and readout of a photocurrent. A photocurrent is retained in the capacitor while the retention TFT is in an OFF state, and once the retention TFT is turned ON, the stored photocurrent is read in one time.

In the aforementioned construction, pixel TFTs, TFDs used in the photosensor sections, retention TFTs, and driving circuit TFTs need to be formed on the same substrate. From a production-process perspective, these TFTs and TFDs are preferably formed through a common process by using the same semiconductor film.

However, these TFTs have respectively different required electrical characteristics. Specifically, a driving circuit TFT needs to perform a high-speed operation; therefore, a driving circuit TFT is required to have a large drive current, i.e., a large ON current. On the other hand, a pixel TFT and a retention TFT are required to have a small OFF-leakage current. In a liquid crystal display device, a voltage that is applied across the liquid crystal needs to be retained throughout the period of one frame, until the screen is rewritten. If a pixel TFT has a large OFF current (OFF-leakage current), the voltage applied across the liquid crystal will lower with time, thus possibly deteriorating the displaying characteristics. Moreover, in a photosensor section, in order to more accurately convert a minute photocurrent occurring in a TFD into a sensing signal, it is required that the retention TFT has a small OFF-leakage current in a retention period, during which the retention TFT is placed in an OFF state to retain the photocurrent in a capacitor.

Note that, because of the need to retain minute charges occurring in a TFD, a retention TFT is required to have superior low-leakage characteristics to those of a pixel TFT. As one example, under a drain voltage Vd of $-7$ V and a gate voltage Vg of $-10$ V, required specifications of a retention TFT may be an OFF-leakage current Ioff of less than 2 pA (a value measured up to a temperature of 60° C. and under white light of 10000 lx). On the other hand, required specifications of a pixel TFT may only be an OFF-leakage current Ioff of less than 13 pA under a gate voltage Vg of $-5$ V and a drain voltage Vd of 12 V. Furthermore, depending on the photo-leakage current, the OFF-leakage current Ioff may increase above 13 pA.

Thus, a pixel TFT and a retention TFT are similar in that their OFF-leakage currents are both preferably small. However, the more specific ON characteristics and OFF characteristics required of these TFTs are different, e.g., preferable ranges of the ON current and the OFF-leakage current, depending on the applications and the like of these TFTs.

Therefore, the TFT characteristics of the pixel TFT and the retention TFT need to be respectively controlled, without complicating the production process or increasing the number of production steps.

The present invention has been made in view of the above circumstances, and an objective thereof is to, in a semiconductor device having a photosensor section utilizing a thin film diode, control the characteristics of a thin film transistor for use in a pixel and a thin film transistor for use in the photosensor section, in accordance with the characteristics required of the respective thin film transistors.

Solution to Problem

A semiconductor device according to the present invention is a semiconductor device having a display region including a plurality of pixels, comprising: a substrate; a first thin film transistor of a first conductivity type formed on the substrate for each pixel; and a plurality of photosensor sections formed in the display region on the substrate for detecting light and generating sensing signals, wherein, each of the plurality of photosensor sections includes a photodetecting portion including at least one thin film diode, a capacitor for storing a photocurrent occurring in the at least one thin film diode, and a second thin film transistor of the first conductivity type disposed between the photodetecting portion and the capacitor, the photodetecting portion being connected to the capacitor via the second thin film transistor; the first and second thin film transistors and the at least one thin film diode have semiconductor layers made of a same semiconductor film; the semiconductor layers of the first and second thin film transistors each include source and drain regions and a channel region located between the regions; and a characteristic of the first thin film transistor and a characteristic of the second thin film transistor are different.

In a preferred embodiment, a threshold voltage of the first thin film transistor is different from a threshold voltage of the second thin film transistor.

In a preferred embodiment, the channel regions of the first and second thin film transistors each contain an impurity of a second conductivity type different from the first conductivity type; and the impurity of the second conductivity type has respectively different concentrations in the channel regions of the first and second thin film transistors.

In a preferred embodiment, an OFF-leakage current of the first thin film transistor is different from an OFF-leakage current of the second thin film transistor.

An OFF-leakage current of the second thin film transistor may be smaller than an OFF-leakage current of the first thin film transistor.

In a preferred embodiment, the second thin film transistor includes low-concentration impurity regions formed between the source and drain regions and the channel region, the low-concentration impurity regions containing an impurity of the first conductivity type at a lower concentration than in the source and drain regions, the low-concentration impurity regions not overlapping a gate electrode.

The first thin film transistor may include low-concentration impurity regions formed between the source and drain regions and the channel region, the low-concentration impurity regions containing an impurity of the first conductivity type at a lower concentration than in the source and drain regions, the low-concentration impurity regions not overlapping a gate electrode; and the impurity of the first conductivity type may have respectively different concentrations in the low-concentration impurity regions of the first and second thin film transistors.

The second thin film transistor may have a multi-gate structure.

The second thin film transistor may have a triple-gate structure.

In a preferred embodiment, between the semiconductor layer of the second thin film transistor and the substrate, a light shielding layer is formed so as to overlap at least the channel region of the semiconductor layer of the second thin film transistor.

The light shielding layer may have a fixed potential.

A sensor light shielding layer may be disposed between the semiconductor layer of the at least one thin film diode and the substrate, the sensor light shielding layer and the light shielding layer being electrically connected.

In a preferred embodiment, the semiconductor layer of the thin film diode includes a p type region, an n type region, and an intrinsic region located between the p type region and the n type region.

The first conductivity type may be n, and the second conductivity type may be p.

A preferred embodiment further comprises another thin film transistor formed in a region other than the display region on the substrate, wherein, the other thin film transistor has a semiconductor layer being made of the same semiconductor film and having source and drain regions and a channel region; and a characteristic of the other thin film transistor is different from a characteristic of the second thin film transistor.

In a preferred embodiment, the impurity of the second conductivity type has respectively different concentrations in the channel regions of the other thin film transistor and the second thin film transistor.

A preferred embodiment further comprises a backlight for emitting visible light and infrared light, wherein the thin film diode is capable of detecting the infrared light.

The photosensor section may be disposed corresponding to each pixel or set of two or more pixels.

Another semiconductor device according to the present invention comprises: a substrate; a plurality of first thin film transistors of a first conductivity type formed on the substrate; and a plurality of photosensor sections formed on the substrate for detecting light and generating sensing signals, wherein, each of the plurality of photosensor sections includes a photodetecting portion including at least one thin film diode, a capacitor for storing a photocurrent occurring in the at least one thin film diode, and a second thin film transistor of the first conductivity type disposed between the photodetecting portion and the capacitor, the photodetecting portion being connected to the capacitor via the second thin film transistor; the first and second thin film transistors and the at least one thin film diode have semiconductor layers made of a same semiconductor film; the semiconductor layers of the first and second thin film transistors each include source and drain regions and a channel region located between the regions; and a characteristic of the first thin film transistor and a characteristic of the second thin film transistor are different.

Advantageous Effects of Invention

According to the present invention, in a semiconductor device having a photosensor section utilizing a thin film diode, it is possible to control the characteristics of a thin film transistor for use in a pixel and a thin film transistor for use in the photosensor section, in accordance with the characteristics required of the respective thin film transistors.

DESCRIPTION OF EMBODIMENTS (First Embodiment)

Figure 1:
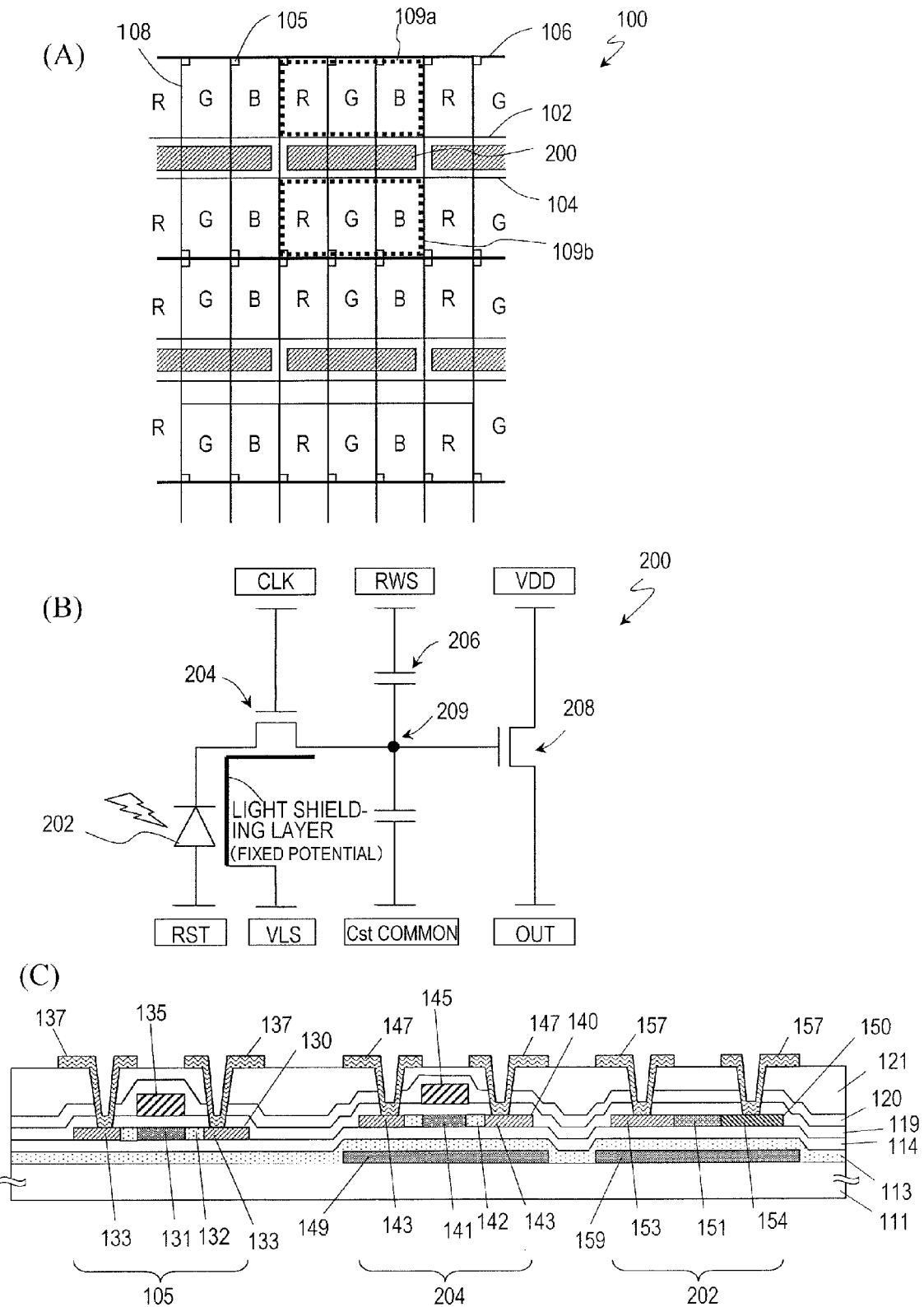
[FIG. 1] (A) is a plan view illustrating an exemplary construction of a semiconductor device 100 according to a first embodiment of the present invention; and (B) is a circuit diagram illustrating an exemplary construction of a photosensor section 200 shown in (A). (C) is a cross-sectional view of a pixel TFT, a retention TFT, and a photosensor TFD.

A semiconductor device according to the present embodiment is an active matrix substrate having photosensor sections. The active matrix substrate of the present embodiment is broadly applicable to display devices, such as liquid crystal display devices and organic EL display devices. In particular, it is suitably used for liquid crystal display devices having a touch-screen panel function.

FIG. 1(A) is a schematic plan view showing an example of a semiconductor device 100 of the present embodiment, and FIG. 1(B) is a circuit diagram showing the construction of a photosensor section 200 of the semiconductor device 100. FIG. 1(C) is a schematic cross-sectional view showing an example of a pixel TFT, a retention TFT, and a photosensor TFD used in the semiconductor device 100.

The semiconductor device 100 is used as a rear substrate of an active matrix type display device. The example shown in the figure illustrates a construction where one photosensor section is provided for two color displaying pixels each composed of R, G, and B pixels.

As shown in FIG. 1(A), the semiconductor device 100 includes a plurality of R, G, and B pixels arranged in a matrix array, and a plurality of photosensor section 200. Each pixel is formed in a region which is surrounded by source bus lines 108, a gate bus line 106, and an RST signal line 102 or an RWS signal line 104, for example. Each pixel has a thin film transistor (pixel TFT) 105 for use in pixel switching and a pixel electrode (not shown). As used herein, any set of pixels 109a, 109b composed of adjacent R, G, and B pixels is referred to as a "color displaying pixel". In the example shown in the figure, one photosensor section 200 is disposed for two adjacent color displaying pixels 109a and 109b.

The photosensor section 200 is disposed between an RST signal line 102 and an RWS signal line 104. The RST signal line 102 and the RWS signal line 104 are provided between two adjacent gate bus lines 106. These lines 102 and 104 are made of the same layer as the gate bus lines 106.

The source side of a pixel TFT 105 is connected to a source bus line 108 for pixels, and the drain side is connected to a pixel electrode. The pixel TFT 105 is turned ON or OFF by a signal from a gate bus line 106 for pixels. As a result, in the display device, voltages can be applied across the liquid crystal layer via the pixel electrodes and a counter electrode which is formed on a front substrate, the front substrate being placed to oppose the rear substrate.

As shown in FIG. 1(B), each photosensor section 200 includes: a photodetecting portion including a thin film diode for use as a photosensor (photosensor TFD) 202; a capacitor 206 for storing a photocurrent occurring in the photosensor TFD 202; a thin film transistor 204 interposed between the photosensor TFD 202 and the capacitor 206; and a thin film transistor (buffer TFT) 208 for signal amplification. Via the thin film transistor 204, the photosensor TFD 202 is connected to the capacitor 206 and a gate of the buffer TFT 208. The thin film transistor 204 performs control so that a photocurrent occurring in the photosensor TFD 202 is kept stored in the capacitor 206 for a certain period, and is read in one time with appropriate timing. In the present specification, any thin film transistor 204 having this function will be referred to as a retention TFT. In the photosensor section 200, while the retention TFT 204 is in an OFF state, the photocurrent is retained in the capacitor 206.

In the present embodiment, the semiconductor layers 140 and 130 of the retention TFT 204 and the pixel TFT 105 are made of the same semiconductor film, but the characteristics of these TFTs are controlled so as to be different from each other, in accordance with the respective ON characteristics and OFF characteristics that are required of them. When it is said that "TFTs have different characteristics", differing threshold voltages, differing OFF-leakage currents, and so on are meant.

For example, the threshold voltage of the retention TFT 204 and the threshold voltage of the pixel TFT 105 may be different. In this case, the threshold voltage of the pixel TFT 105 may be higher than the threshold voltage of the retention TFT 204. As a result, the retention TFT can be operated with a lower driving voltage than that for the pixel TFT. Thus, while ensuring predetermined ON characteristics, operation can be achieved with as low a voltage as possible. As a result, increase in current consumption can be suppressed even though sensor circuitry is incorporated into the display device.

The threshold voltages of these TFT may be made different by imparting different impurity concentrations to the channel regions of the retention TFT 204 and the pixel TFT 105. As a result, even when the retention TFT 204 and the pixel TFT 105 have the same structure (e.g., an LDD structure described below), it can be ensured that the ON characteristics and OFF characteristics of the TFTs 105 and 204 are different.

Moreover, the retention TFT 204 and the pixel TFT 105 may have differing OFF-leakage currents. Preferably, the OFF-leakage current of the retention TFT 204 is smaller than the OFF-leakage current of the pixel TFT 105. In the photosensor section 200, in order to accurately convert a minute photocurrent occurring in the photosensor TFD 202 into a sensor signal, the leakage current of the retention TFT 204 needs to be kept small in the retention period during which it is retained in the capacitor 206, i.e., a period in which the retention TFT 204 is in an OFF state. The reason is that, if the leakage current is large, the amount of charge retained in the capacitor 206 will decrease, thus possibly degrading the sensing characteristics.

In order to keep the OFF-leakage current of the retention TFT 204 small, the semiconductor layer of the retention TFT 204 may have a low-concentration impurity region (Lightly Doped Drain, which may hereinafter be abbreviated as "LDD region") between the channel region and at least one of the source region and the drain region. Preferably, the LDD region(s) does not overlap the gate electrode, i.e., it is offset toward the source/drain region(s) and away from the gate electrode. Such a structure is referred to as an "LDD structure". With an LDD structure, field concentration near the drain can be alleviated by the LDD region(s), so that the OFF-leakage current can be greatly reduced as compared to a TFT lacking an LDD region ("single drain structure").

Instead of an LDD structure or in addition to an LDD structure, the retention TFT 204 may have a structure (multi-gate structure) such that two or more gate electrodes are provided in series for one semiconductor layer. This allows the voltage applied between the source/drain to be distributed, whereby the OFF-leakage current can be suppressed more effectively. In a multi-gate structure, a plurality of channel regions are formed in one semiconductor layer (also referred to as a multi-channel structure). For example, three gate electrodes may be provided in series so as to overlap the semiconductor layer, thus forming three channel regions in the semiconductor layer (triple gate structure, triple channel structure).

Moreover, it is preferable that the retention TFT 204 has a light shielding layer at the opposite side of the semiconductor layer from the gate electrode. As a result, the leakage current associated with light entering the channel region can be reduced. Moreover, by fixing the potential of the light shielding layer, it becomes possible to more effectively prevent an OFF-leakage current from flowing in the semiconductor layer based on a backgate effect.

On the other hand, the pixel TFT 105 also is required to have a small OFF-leakage current, as mentioned earlier. Therefore, it is also preferable for the pixel TFT 105 to have an LDD structure. Moreover, it preferably has a multi-gate structure. Note that, in the case where the pixel TFT 105 and the retention TFT 204 both have an LDD structure, the impurity concentrations of the LDD regions of these TFTs may be different from each other. As a result, OFF-leakage characteristics of the pixel TFT 105 and the retention TFT 204 can be controlled in accordance with the respective characteristics required of them.

Hereinafter, with reference to FIG. 1(C), the construction of the pixel TFT 105, the retention TFT 204, and the photosensor TFD 202 according to the present embodiment will be described more specifically. Although a single gate-structure TFT having an LDD structure is illustrated for the pixel TFT 105 and the retention TFT 204, their TFT structures are not limited thereto.

The pixel TFT 105, the retention TFT 204, and the photosensor TFD 202 are formed all on the same substrate 111, via underlying films 113 and 114. Moreover, as active regions, they have semiconductor layers 130, 140, and 150, which are made of the same semiconductor film.

The pixel TFT 105 includes a semiconductor layer 130, a gate insulating film 119 formed on the semiconductor layer 130, a gate electrode 135 provided on the gate insulating film 119, protection films 120 and 121 formed so as to cover the gate electrode 135 and the semiconductor layer 130, and source and drain electrodes 137. The semiconductor layer 130 includes source and drain regions 133, a channel region 131 located between these regions, and LDD regions 132 located between the source and drain regions 133 and the channel region 131. The gate electrode 135 overlaps the channel region 131, but does not overlap the LDD regions 132. Moreover, the source and drain regions 133 are connected respectively to the source and drain electrodes 137, within contact holes formed in the protection film 130.

Similarly to the pixel TFT 105, the retention TFT 204 has an LDD structure. Specifically, it includes the semiconductor layer 140, a gate electrode 145 which is provided on the semiconductor layer 140 via the gate insulating film 119, the protection films 120 and 121, and source and drain electrodes 147. The semiconductor layer 140 includes source and drain regions 143, a channel region 141, and LDD regions 142 located between the source and drain regions 143 and the channel region 141. The gate electrode 145 overlaps the channel region 141, but does not overlap the LDD regions 142. The source and drain regions 143 are connected respectively to the source and drain electrodes 147, within contact holes formed in the protection film 140.

Moreover, on the substrate 111 side of the semiconductor layer 140 of the retention TFT 204, a light shielding layer 149 is provided via the insulation films 113 and 114. The light shielding layer 149 is disposed so as to at least overlap the channel region 141 of the semiconductor layer 140. Preferably, as shown in the figure, it is disposed so as to overlap the entire semiconductor layer 140. The light shielding layer 149 prevents light from entering the semiconductor layer 140 from the substrate 111 side to cause a leakage current. Moreover, in the present embodiment, the light shielding layer 149 is connected to a VLS line and has its potential fixed. As a result, an OFF-leakage current of the retention TFT 204 can be reduced more effectively based on a backgate effect.

In the present embodiment, the pixel TFT 105 and the retention TFT 204 are both n channel type TFTs. Preferably, the channel regions 131 and 141 of these TFTs are doped with a p type impurity, e.g., boron (channel doping), for threshold voltage adjustment. The concentration of the p type impurity is separately controlled by taking the characteristics and threshold voltages required of the respective TFTs into consideration.

When the light shielding layer 149 with a fixed potential is provided on the substrate 111 side of the retention TFT 204, the ON characteristics will vary depending on the setting value of the potential of the light shielding layer 149. Specifically, the ON current Ion increases as the potential of the light shielding layer 149 is increased, and the ON current Ion decreases as the potential is decreased. Therefore, in the case where the light shielding layer 149 is set at a minus potential, in order for the ON current Ion of the retention TFT 204 to satisfy the specifications, it is preferable to set the concentration of the p type impurity in the channel region 141 of the retention TFT 204 to be lower than the concentration of the p type impurity in the channel region 131 of the pixel TFT 105. As a result, while ensuring desired characteristics in the pixel TFT 105, desired ON characteristics can be obtained in the retention TFT 204 by suppressing a decrease in its ON current that is associated with the light shielding layer 149.

Moreover, the n type impurity concentrations in the LDD regions 132, 142 of the pixel TFT 105 and the retention TFT 204 may also be separately controlled by taking the characteristics required of the respective TFTs into consideration. For example, as mentioned above, when the p type impurity concentration in the channel region of the retention TFT 204 is kept low, there may be cases where the OFF-leakage current of the retention TFT 204 cannot be sufficiently reduced by channel doping. In such cases, the concentration of the n type impurity in the LDD regions 142 of the retention TFT 204 may be set lower than the concentration of the n type impurity in the LDD regions 132 of the pixel TFT 105. As a result, while ensuring desired characteristics of the pixel TFT 105, the OFF-leakage current can be reduced to fit in a desired range in the retention TFT 204, with its ON characteristics being conserved.

The photosensor TFD 202 includes: the semiconductor layer 150 having an n type region 153, a p type region 154, and an intrinsic region 151 located therebetween; and electrodes 157 which are respectively connected to the n type region 153 and the p type region 154. The intrinsic region 151 serves as a photodetecting region. Moreover, on the substrate 111 side of the semiconductor layer 150, a light shielding layer 159 is provided via the insulation films 113 and 114. The light shielding layer 159 is disposed so as to overlap at least the intrinsic region 151 of the semiconductor layer 150. Since the light shielding layer 159 prevents light from entering the intrinsic region 151 from the substrate 111 side to cause a photocurrent, it is possible to more accurately sense the light entering the intrinsic region 151 from above the semiconductor layer 150.

In the present specification, an "intrinsic region" refers to a region which is interposed between a p type region and an n type region, and which has a lower impurity concentration (i.e., higher resistance) than do these regions. Therefore, the intrinsic region may be a region composed of an intrinsic semiconductor, or a region in which a p type or n type impurity is implanted at a lower concentration than in the p type region and the n type region.

It is preferable that the potential of the light shielding layer 159 is fixed. If the light shielding layer 159 is floating, the light shielding layer 159 may be charged with electric charge, thus possibly changing the characteristics of the photosensor TFD 202. The light shielding layer 159 may be electrically connected with the light shielding layer 149 under the retention TFT 204, and connected to the VLS line. As a result, the potentials of the light shielding layers 149 and 159 fixed by using a common line, which is advantageous.

Although FIG. 1(C) only shows the construction of the photosensor TFD 202 and the TFTs 105 and 204, the buffer TFT 208 is also preferably made of a semiconductor layer which is formed by using the same semiconductor film as these TFD and TFTs. The structure of the buffer TFT 208 may be a single drain structure lacking LDD regions, for example.

The capacitor 206 for signal storage may be constructed with the gate electrode layer and the semiconductor layer composed of the semiconductor film as the electrodes, such that the gate insulating film provides its capacitance.

Although not shown in the figure, the p type region 154 of the photosensor TFD 202 is connected to the RST signal line, and the n type region 153 is connected to the drain electrode 147 of the retention TFT 204. The gate electrode 145 of the retention TFT 204 is connected to a CLK signal line, and the source electrode 147 is connected to a lower electrode (semiconductor layer) of the capacitor 206, so as to be connected to the RWS signal line via the capacitor 206. The source electrode 147 of the retention TFT 204 is also connected to the gate electrode of the buffer TFT 208. The drain electrode of the buffer TFT 208 is connected to a VDD signal line, and the source electrode is connected to an output signal line.

The construction of the semiconductor device of the present embodiment is not limited to the construction shown in FIG. 1. Although FIG. 1(A) illustrates that one photosensor section 200 is provided for two color displaying pixels 109a and 109b, the number of photosensor sections relative to the number of pixels (density) can be selected as appropriate, depending on the resolving power. For example, one photosensor section 200 may be provided for one, or three or more, color displaying pixel(s). Alternatively, one photosensor section 200 may be provided for a pixel corresponding to one primary color, or a plurality of sets of pixels.

Although FIG. 1(C) illustrates TFTs of an LDD structure as the pixel TFT 105 and the retention TFT 204, these TFTs may not have an LDD structure. Moreover, they may have a multi-gate structure. Furthermore, the light shielding layers 149 and 159 may not be provided on the rear face side of the retention TFT 204 and the photosensor TFD 202.

Each photosensor section may have a plurality of photosensor TFDs. For example, in addition to the photosensor TFD 202, another photosensor TFD having a different detectable wavelength region from that of the photosensor TFD 202 may be provided. Alternatively, a plurality of photosensors TFD of the same type may be connected in parallel for an enhanced output.

Next, with reference to FIG. 2, the construction of the display device of the present embodiment will be described by taking a touch-screen panel liquid crystal display device having touch-screen panel sensors as an example.

Figure 2:
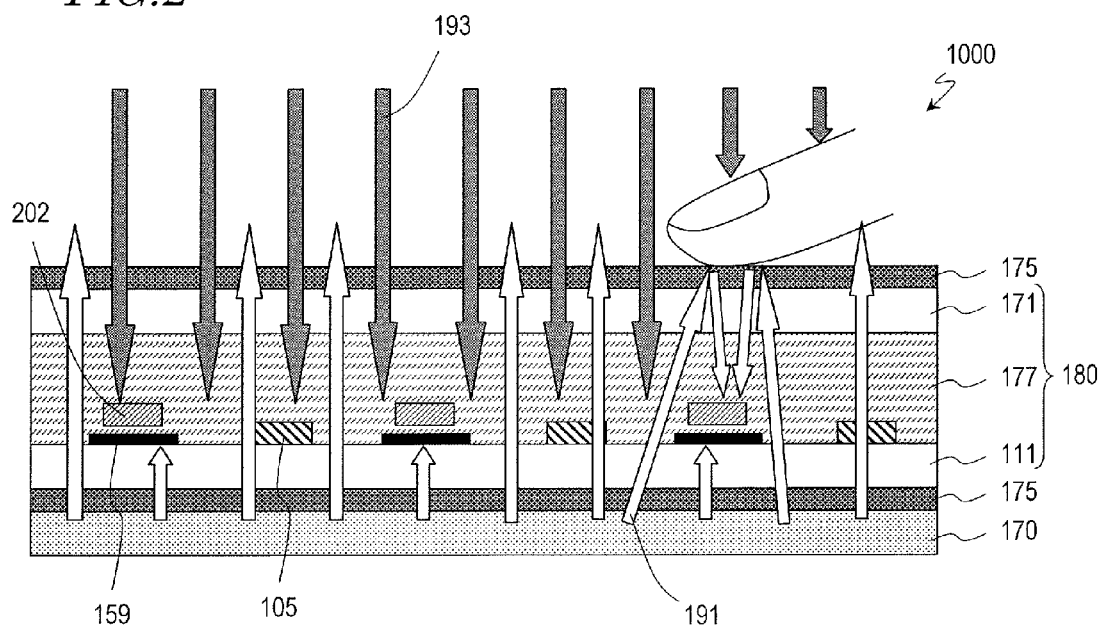
[FIG. 2] A schematic cross-sectional view showing an example of a display device in which the semiconductor device according to the first embodiment of the present invention is used.

FIG. 2 is a schematic cross-sectional view showing an example of a touch-screen panel liquid crystal display device of an active matrix type. For simplicity, those constituent elements having similar counterparts in FIG. 1 are denoted by like reference numerals.

The liquid crystal display device 1000 includes a liquid crystal module 180 and a backlight 170 disposed on the rear face side of the liquid crystal module 180. The liquid crystal module 180 is composed of a translucent rear substrate 111, a front substrate 171 placed to oppose the rear substrate, and a liquid crystal layer 177 provided between these substrates. Polarizers 175 are respectively provided on the viewer side of the front substrate 171 and the rear face side of the rear substrate 111. The liquid crystal module 180 has a plurality of pixels (pixels corresponding to primary colors), each pixel having a pixel electrode (not shown) and a pixel TFT 105 connected to the pixel electrode. Moreover, a photosensor section including a photosensor TFD 202 is disposed adjacent to each color displaying pixel that is composed of pixels corresponding to three primary colors (RGB).

Although a color filter (not shown) is provided on the viewer side of each pixel, it is preferable that no color filter is provided on the viewer of the photosensor section. If a color filter is provided on the viewer of the photosensor section, the sensitivity of the photosensor TFD 202 composing the photosensor section may be deteriorated.

The light shielding layer 159 is disposed between the photosensor TFD 202 and the backlight 170. Therefore, light 191 from the backlight 170 is blocked by the light shielding layer 159, thus not entering the photosensor TFD 202 from the rear face (from the rear substrate 111 side). Note that the light shielding layer 159 may be disposed in such a manner that at least light from the backlight 170 is prevented from entering the intrinsic region of the photosensor TFD 202.

Each photosensor section is able to sense an object which is touching the screen by using external light 193 entering the display device 1000. Alternatively, an object which is touching the screen may be sensed by using light (light coming from the backlight) which is emitted from the backlight 170. Alternatively, a construction may be adopted which enables sensing by using both of external light 193 and light 191 coming from the backlight. For example, depending on the environment of use of the display device 1000, sufficient external light 193 may not enter the display region; however, even in such cases, sensing can be performed by using light 191 coming from the backlight.

Sensing by using light 191 coming from the backlight can be performed as follows. The light 191 coming from the backlight passes through the display panel and reaches the panel surface. When reflected from an object such as a finger pad, it enters a photosensor section which is disposed in the display region. Therefore, by sensing the light entering the photosensor section, the object which is touching the screen can be detected. In the case of using light 191 coming from the backlight, a TFD which is capable of detecting the light 191 coming from the backlight needs to be used as the photosensor TFD 202.

Preferably, the backlight 170 emits infrared light in addition to visible light. As a result, the photosensor section becomes capable of performing sensing by using the infrared light which emanates from the backlight 170.

The reason why sensing is possible by using infrared light is described. When sensing is performed by using visible light which is emitted from a backlight (referred to as "visible light coming from the backlight"), the visible light coming from the backlight which has passed through the liquid crystal layer 177 is blocked by a viewer-side polarizer in any pixel where the display panel is displaying "black", and does not reach an object which is touching the screen. Therefore, when visible light coming from the backlight is utilized, the sensing sensitivity may possibly be degraded through displaying. On the other hand, when sensing is performed by using infrared light which is emitted from a backlight, the aforementioned problem of dependence of display can be overcome. Unlike visible light, infrared light is transmitted through the polarizer even in pixels which are displaying black. Therefore, irrespective of displaying, sensing can be performed with a predetermined sensitivity by using infrared light.

In the case where sensing is performed by using infrared light, a TFD which is capable of detecting infrared light (wavelength: 0.7 μm or more, energy: 1.7 eV or less) may be used as the photosensor TFD 202. The photosensor TFD 202 may be capable of detecting not only infrared light but also visible light. In the case where sensing is mainly performed with infrared light, the photosensor TFD 202 is preferably capable of detecting infrared light with a higher sensitivity than that for visible light. In the case where sensing is performed with both visible light and infrared light, a first photosensor TFD which is capable of detecting visible light with a high sensitivity and a second photosensor TFD which is capable of detecting infrared light may be connected in parallel in each photosensor section. Note that, the range of light wavelengths that each photosensor TFD is capable of detecting may be adjusted as appropriate, depending on the semiconductor layer thickness, crystal grain size, the thickness of each layer above the semiconductor layer, the thickness of an interlayer film (base coating) between the semiconductor layer and the light shielding layer, and so on, for example.

Next, an exemplary sensing operation by a photosensor section in the display device 1000 will be described.

1) Charging period: first, a potential of minus 7 V (−7 V) is applied to the RST line, thereby placing the photosensor TFD 202 in a reverse bias state. At this time, a plus potential is also applied to the CLK line, thereby placing the retention TFT 204 in an ON state. In this state, if a photo-leakage occurs as light enters the photosensor TFD 202, the potential of the n type-region side of the photosensor TFD 202 decreases. Via the photosensor TFD 202, a minus field occurs at a node 209 by way of the capacitance of the RWS capacitor signal line (0 V).

2) Retention period: after the lapse of a predetermined period, the retention TFT 204 is placed in an OFF state, whereby the potential of the node 209, which has been made minus by the photo-leakage current, remains lowered.

3) Read period: during a read, the RWS potential is made plus (12 V), whereby the gate voltage being applied to the buffer TFT 208 changes. To the drain side of the buffer TFT 208, a VDD signal is applied from the VDD signal line. When the gate voltage changes as above, the value of the current that flows to an output (OUT) signal line which is connected at the source side changes, and this electrical signal can be taken out on the output signal line.

4) Thereafter, a current is flowed in a forward direction from the RST line to the photosensor TFD 202 (it is supposed that RST and RWS are at 0 V) to write an RST signal to the capacitor 206, and the potential of the capacitor 206 is reset.

By repeating the operations from 1) to 4) with scanning, light sensing by using external light and light coming from the backlight becomes possible.

The present embodiment is also applicable to a sensing method which only uses infrared light that is emitted from the backlight. This sensing method is described in International Publication No. 2011/040090, International Publication No. 2011/040091, and International Publication No. 2011/040093, and so on by the Applicants, for example. These applications describe methods where a TFD for ambient light detection is provided in addition to the aforementioned photosensor TFD 202 to eliminate the influences of infrared that is contained in ambient light.

Figure 12:
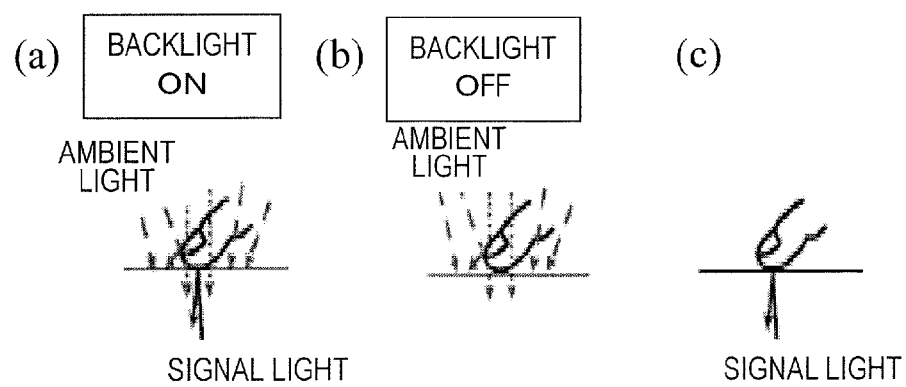
[FIG. 12] (a) to (c) are schematic diagrams for explaining an exemplary method of sensing which only utilizes light coming from the backlight.
Figure 13:
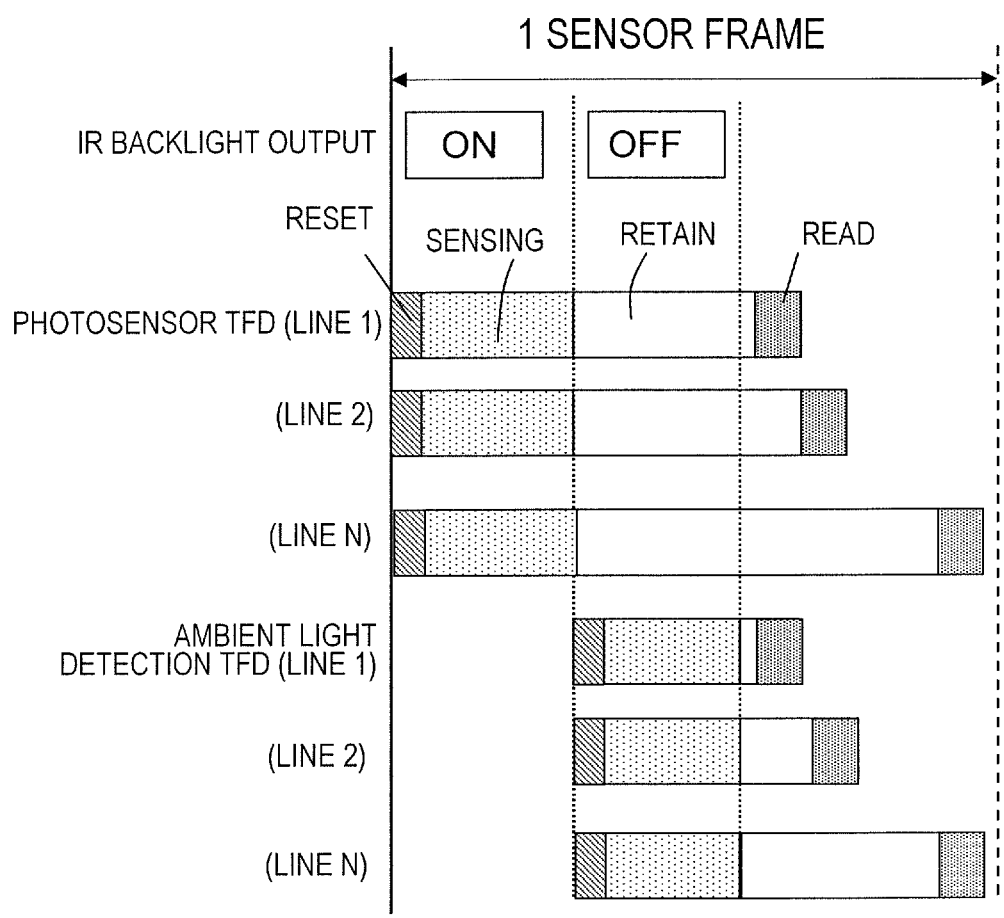
[FIG. 13] A diagram showing an operation timing of a sensor according to the sensing method shown in FIG. 12.

Specifically, first, as shown in FIG. 12(a), the backlight is turned ON and sensing is performed with the photosensor TFD. In the photosensor TFD, not only light coming from the backlight (signal light) but also ambient light is detected. Next, as shown in FIG. 12(b), the backlight is turned OFF, and only ambient light is detected by using an ambient light detection TFD. Thereafter, a difference between the sensor signal when the backlight was ON and the sensor signal by the ambient light detection TFD when the backlight was OFF is derived, whereby a sensor signal by the signal light alone can be obtained, as shown in FIG. 12(c). In this method, as shown in FIG. 13, a period after performing sensing at the photosensor TFD and until reading out the sensor signal defines the "retention period". According to the present embodiment, by placing the retention TFT 204 in an OFF state, the potential of the node 209 can be conserved during this retention period (aforementioned 2)).

Note that, relative to any method which always keeps the backlight ON, use of the above method can shorten the time during which the backlight is ON, whereby power consumption can be reduced.

Without being limited to touch-screen panel liquid crystal display devices, the present embodiment is applicable also to image sensors or display devices having a fingerprint sensor function. The aforementioned photosensor section 200 can also be used as an image sensor or a fingerprint sensor. In the case where it is used as an image sensor or a fingerprint sensor, generally speaking, a higher resolution than that of a touch sensor is needed in order to detect an image or fingerprint that is pressed against the screen. The resolution increases as the number of photosensor sections per pixel increases; therefore, the number of photosensor sections may be adjusted as appropriate depending on to the application. When one photosensor section is disposed for two color displaying pixels as shown in FIG. 1(A), a resolution which is sufficient for enabling reading of an image on a business card or the like can be obtained. Furthermore, by disposing a color filter on the viewer side of a photosensor section, and receiving the light which has passed through the color filter with the photosensor section, the photosensor section can be allowed to function as a color image sensor.

Concerning the retention TFT, a relationship was studied between: the potential of the light shielding layer, the concentration of a P type impurity (which herein is boron) in the channel region, and the resistance value of the LDD regions; and the TFT characteristics. The results thereof will be described.

Figure 3:
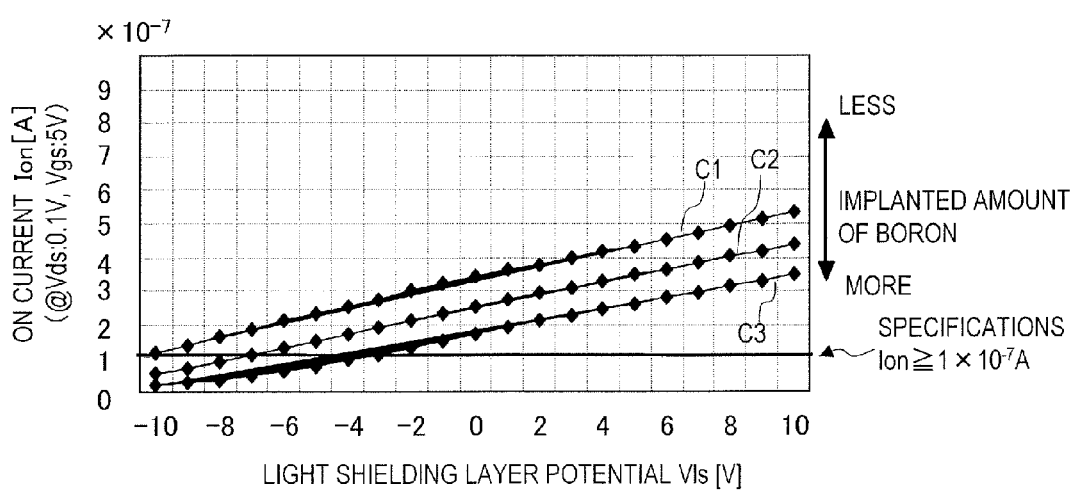
[FIG. 3] A graph showing a relationship between a potential Vls of a light shielding layer, and an ON current Ion, of a retention TFT, where an amount of boron implanted into a channel region is varied.

FIG. 3 is a graph showing a relationship between a potential Vls of the light shielding layer, and an ON current Ion, of the retention TFT, where the amount of boron implanted into a channel region is varied. In FIG. 3, the horizontal axis represents the potential of the light shielding layer (fixed) (V), whereas the vertical axis represents an ON current Ion (A) when the drain-source voltage Vds is 0.1 V and the gate-source voltage Vgs is 5 V. Moreover, line C1 in FIG. 3 gives a graph indicating a relationship between the potential Vls of the light shielding layer and the ON current Ion when the boron concentration in the channel region is $2.6 \times 10^{17}/cm^3$. Similarly, lines C2 and C3 give graphs indicating relationships between the potential Vls of the light shielding layer and the ON current Ion when the boron concentration in the channel region is $3.8 \times 10^{17}/cm^3$ and $5.0 \times 10^{17}/cm^3$, respectively.

As can be seen from FIG. 3, the ON current Ion changes depending on the potential Vls of the light shielding layer and on the boron concentration in the channel region. Specifically, as the potential Vls of the light shielding layer decreases, the ON current Ion decreases. Moreover, as the boron concentration (implanted amount of boron) in the channel region increases, the ON current Ion decreases. This is considered to be because an increased boron concentration causes carriers to be scattered by the impurity (boron), thus lowering their mobility.

Therefore, the decrease in the ON current Ion which is caused by providing the light shielding layer can be compensated for by keeping the boron concentration low. For example, even when the potential Vls of the light shielding layer is as low as −8 V, a desired ON current Ion (e.g., $1 \times 10^{-7}$ A or more) can be obtained by keeping the boron concentration in the channel region at the concentration of C1 or less.

In the present embodiment, the boron concentration in the channel region of the retention TFT is controlled independently from that of any other TFT. Therefore, irrespective of the characteristics that are required of the other TFTs, the boron concentration in the channel region of the retention TFT can be optimized in accordance with the desired ON characteristics and the potential Vls of the light shielding layer.

Note that, if no light shielding layer is formed in the retention TFT, there will not be any decrease in the ON characteristics due to the potential Vls of the light shielding layer. However, if no light shielding layer is formed, a leakage current may occur when light enters the channel region of the semiconductor layer of the TFT, thus possibly deteriorating the OFF characteristics of the TFT.

Figure 4:
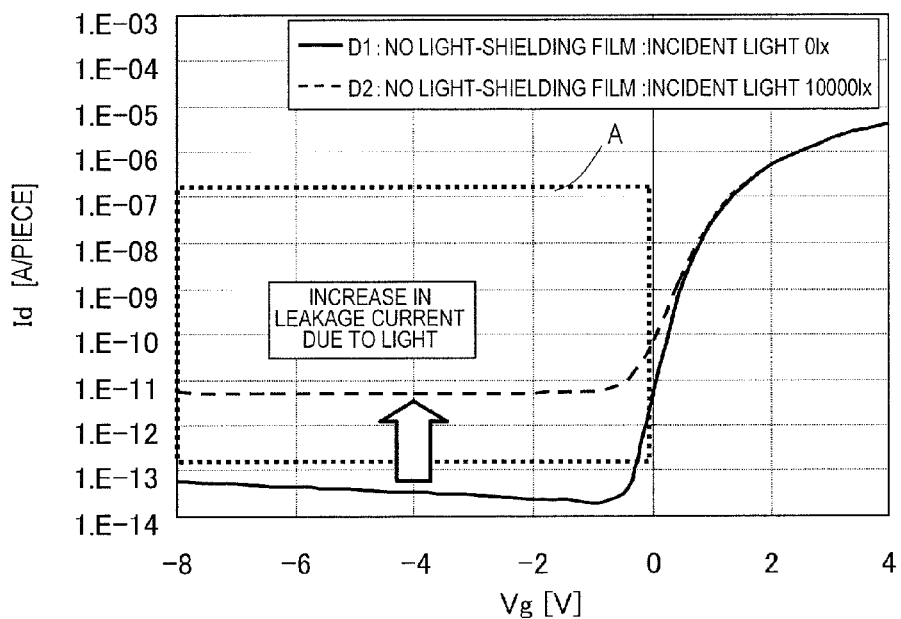
[FIG. 4] A graph illustrating exemplary Vg-Id characteristics of a TFT which lacks a light shielding layer.

FIG. 4 is a graph illustrating exemplary Vg-Id characteristics of a TFT which lacks a light shielding layer. In the retention TFT, if the leakage current at a gate voltage Vg of 0 or less is equal to or greater than $1 \times 10^{-13}$ A/piece (range A indicated in FIG. 4), for example, the sensing characteristics of the photosensor section may be deteriorated. As can be seen from FIG. 4, when light enters the channel region (illuminance: 10000 lx, curve D2), the leakage current is increased over the case where hardly any light enters the channel region (illuminance: 0 lx, curve D1). In this example, the leakage current due to light increases to near $1 \times 10^{-11}$ A/piece, for example, thus falling into range A. This indicates that it is preferable to sufficiently shade at least the channel region of the retention TFT.

Figure 5:
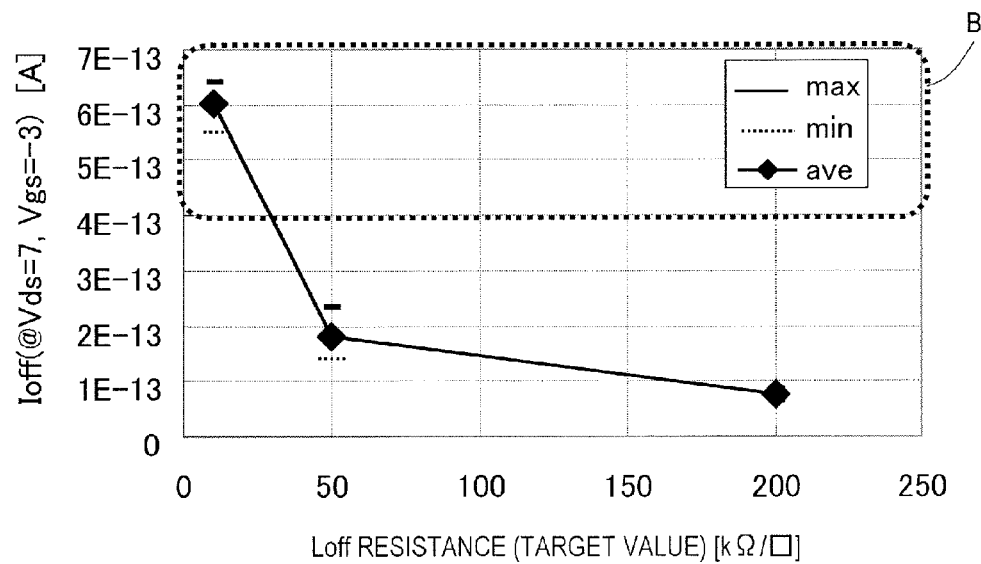
[FIG. 5] A graph illustrating an exemplary relationship between a resistance value Loff of LDD regions, and an OFF current Ioff, of a retention TFT.

FIG. 5 is a graph illustrating an exemplary relationship between a resistance value Loff of LDD regions, and an OFF current Ioff, of a retention TFT. The horizontal axis represents the resistance value Loff (kΩ/□) of the LDD regions. As the impurity concentration (which herein is phosphorus concentration) in the LDD regions becomes higher, the resistance value Loff becomes lower. The vertical axis represents an OFF current Ioff(A) when the drain-source voltage Vds is 7 V and the gate-source voltage Vgs is −3 V.

In the retention TFT, when the OFF current Ioff becomes equal to or greater than $4 \times 10^{-13}$ A, for example, (range B indicated in FIG. 5), the sensing characteristics of the photosensor section may be deteriorated. As can be seen from FIG. 5, by increasing the resistance value Loff of the LDD regions, the OFF current Ioff can be kept small. In the example shown in the figure, the OFF current Ioff can be made sufficiently smaller than $4 \times 10^{-13}$ A when the resistance value Loff is equal to or greater than 50 kΩ/□. Moreover, when the resistance value Loff is 10 kΩ/□, the OFF current Ioff increases to $6 \times 10^{-13}$ A, thus falling into range B.

Therefore, by controlling the resistance value Loff of the LDD regions of the retention TFT independently from that of any other TFT, the resistance value Loff of the LDD regions can be optimized irrespective of the characteristics required of the other TFTs, whereby the OFF characteristics required of the retention TFT can be ensured.

As can be seen from the results shown in FIG. 3 to FIG. 5, by providing a light shielding layer in the retention TFT and optimizing the amount of boron implanted to the channel region of the retention TFT separately from that of any other TFT, the characteristics required of the retention TFT can be realized. As necessary, the implanted amount of phosphorus in the LDD regions of the retention TFT may be optimized separately from that of any other TFT.

In particular, there are cases where, as a result of reducing the amount of boron implanted into a channel region in the retention TFT in order to achieve desired ON characteristics, the OFF-leakage current may not be sufficiently reduced by channel doping. In such cases, by controlling the implanted amount of phosphorus in the LDD regions to optimize the resistance of the LDD regions, the OFF-leakage current can be reduced to fit in a desired range. Thus, it becomes possible to reconcile both the desired OFF characteristics and the ON characteristics.

(Second Embodiment)

Hereinafter, with reference to the drawings, a second embodiment of the semiconductor device according to the present invention will be described. The present embodiment is directed to a display device having photosensor sections.

Hereinafter, the construction of the display device of the present embodiment will be described by taking a liquid crystal display device having touch sensors as an example.

The display device of the present embodiment includes a display region and a frame region located around the display region. The display region has a plurality of pixels and a plurality of photosensor sections. The constructions of the pixels and the photosensor sections may be the constructions described above in the first embodiment. In other words, each pixel includes a pixel electrode and a pixel TFT. Each photosensor section includes at least one photosensor TFD, a capacitor, and a retention TFT. In the frame region, a driving circuit for displaying is provided for driving each pixel. Generally speaking, the driving circuit includes n type TFTs and p type TFTs. Herein, those TFTs which compose the driving circuit will be referred to as driving circuit TFTs.

The driving circuit TFTs, pixel TFTs, retention TFTs, and photosensor TFDs are formed on the same substrate. Moreover, as their active regions, these TFTs and TFDs preferably have semiconductor layers that are made of the same semiconductor film. Moreover, these TFTs and TFDs are preferably formed through a common process.

In the present embodiment, characteristics such as threshold voltage and OFF-leakage characteristics differ between the driving circuit TFTs and the retention TFTs. Similar to the above-described embodiment, the characteristics of these TFTs can be controlled based on the TFT structure, impurity concentration in the channel region, impurity concentration in the LDD regions, presence or absence of a light shielding layer, and so on. Note that the characteristics of the respective TFTs may be different between the driving circuit TFTs, the retention TFTs, and the pixel TFTs.

Hereinafter, with reference to the drawings, an exemplary method of producing a driving circuit TFT, a pixel TFT, a retention TFT, and a photosensor TFD through a common process will be described.

Figure 6:
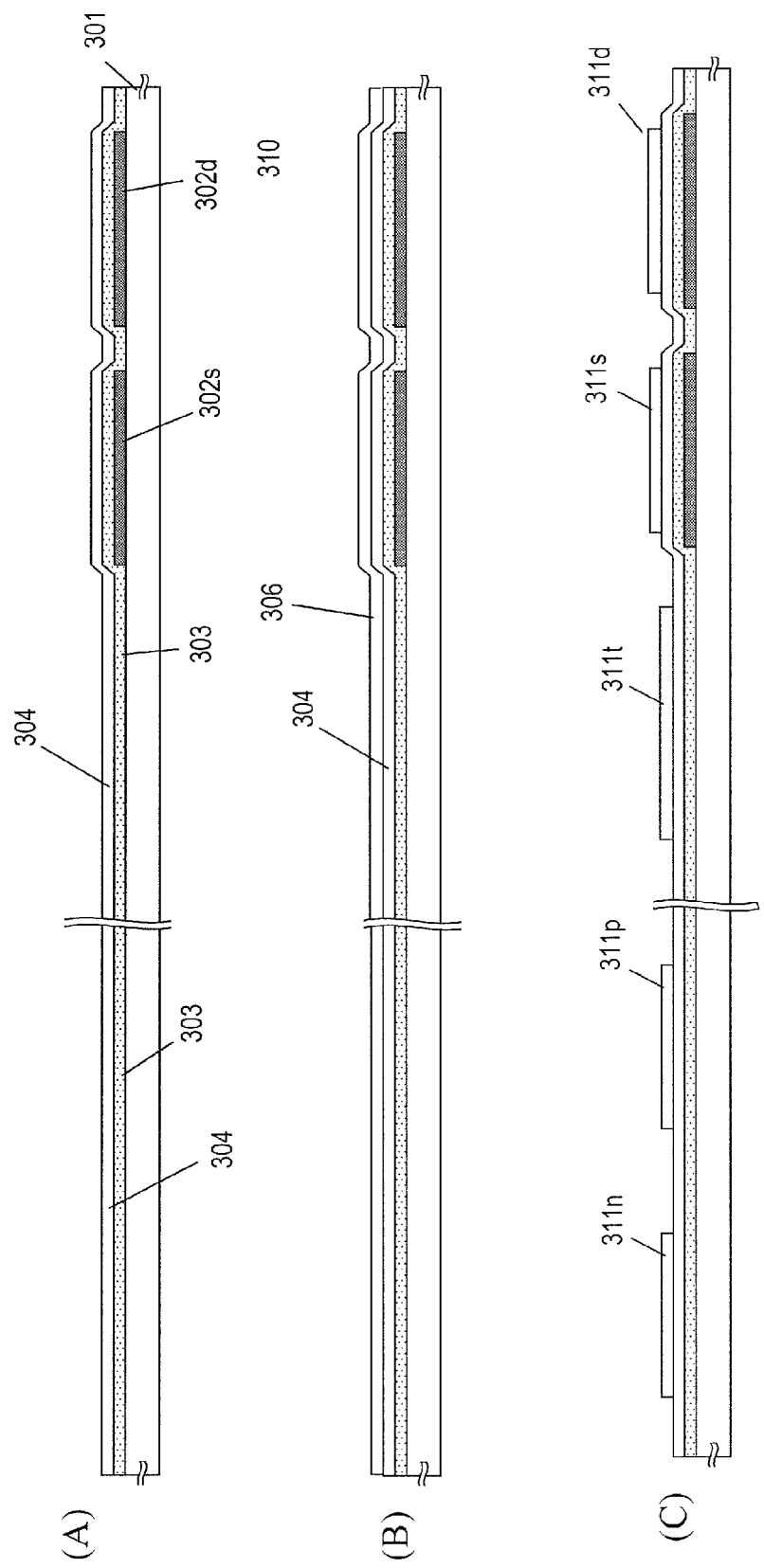
[FIG. 6] (A) to (C) are schematic cross-sectional views showing production steps for a semiconductor device according to a second embodiment of the present invention.

First, as shown in FIG. 6(A), after patterning light shielding layers 302s and 302d on a substrate 301, e.g., a glass substrate, a basecoat insulation film is formed so as to cover the light shielding layers 302s and 302d. The light shielding layers 302s and 302d are disposed so as to be able to block light coming from the rear face side of the substrate toward the retention TFT and the TFD, respectively.

The light shielding layers 302s and 302d are formed as follows, for example. By CVD (Chemical Vapor Deposition) technique, sputtering technique, or the like, a metal film or an insulation film to become the light shielding layers is formed on the surface of the substrate 301. As a metal film, a film whose main component is Ta, Ti, W, Mo, Al, or other elements can be used. As an insulation film, an Si film can be used, for example. The thickness of the metal film or insulation film is preferably 50 nm or more, for example.

As the basecoat insulation film, a silicon oxide film or a silicon nitride film may be formed by CV technique, for example. The basecoat insulation film may be a single-layered, or have a multilayer structure. The basecoat insulation film has a thickness of no less than 100 nm and no more than 500 nm, for example. Herein, as the basecoat insulation film, a silicon nitride film 303 and a silicon oxide film 304 are formed in this order, by using plasma CVD technique.

Although it is illustrated herein that the light shielding layers are respectively disposed on the rear face side of the retention TFT and the TFD, these light shielding layers may not be provided. On the other hand, a light shielding layer may also be provided on the rear face side of any other TFT.

Next, as shown in FIG. 6(B), a semiconductor film 306 is formed on the silicon oxide film 304. Herein, a crystalline silicon film is formed as the semiconductor film 306. The semiconductor film 306 has a thickness of no less than 40 nm and no more than 300 nm, for example. The crystalline silicon film may be formed by depositing an amorphous silicon film on the silicon oxide film 304 and crystallizing it. Although there is no particular limitation as to the method of crystallization, crystallization may be effected by using a catalyst element, or crystallization may be allowed to occur at a low temperature by using an excimer laser or the like, for example.

As one example, a method of crystallizing the amorphous silicon film by using a catalyst element will be described. First, an amorphous silicon film (thickness: e.g., no less than 20 nm and no more than 150 nm) is formed by using a known method such as a plasma CVD technique or a sputtering technique. Thereafter, a catalyst element for promoting crystallization is added to a part or a whole of the surface of the amorphous silicon film. In the present embodiment, a thin film of catalyst element (which herein is a nickel film) is formed on the amorphous silicon film by vapor deposition technique, sputtering technique, or the like. Note that addition of the catalyst element may occur via application, by spin coating technique, of an aqueous solution (nickel acetate aqueous solution) containing a catalyst element (nickel) in an amount by weight of about 1 to 10 ppm, e.g., 5 ppm. As the catalyst element, other than nickel (Ni), one or more elements selected from the group consisting of iron (Fe), cobalt (Co), tin (Sn), lead (Pb), palladium (Pd), and copper (Cu) may be used. Although having smaller catalytic effects than do the above elements, ruthenium (Ru), rhodium (Rh), osmium (Os), iridium (Ir), platinum (Pt), gold (Au), and the like also function as catalyst elements. Next, the amorphous silicon film is subjected to a heat treatment, and the amorphous silicon film is crystallized to obtain a crystalline silicon film. Herein, the amorphous silicon film is subjected to laser anneal, and the thin nickel film and the amorphous silicon film are allowed to react, thereby forming a crystalline silicon at the interface between these films. Thereafter, the unreacted nickel film and the layer of nickel silicide are removed by etching or the like. Next, the remaining silicon film is further subjected to laser anneal, thus performing a further crystallization. In this manner, the crystalline silicon film is obtained.

Instead of laser anneal, a furnace may be used to conduct a heat treatment in an inert atmosphere, e.g., a nitrogen ambient. As the heat treatment, it is preferable to perform 30 minutes to 4 hours of anneal treatment at 500 to 650° C. Alternatively, crystallization may be effected in an RTA (Rapid Thermal Annealing) apparatus which uses a lamp as a heat source.

Next, as shown in FIG. 6(C), unnecessary regions of the semiconductor film 306 are removed by photolithography, thus effecting isolation. As a result, a semiconductor layer 311n to become an active region (source/drain region, channel region) of an n type TFT for driving circuitry, a semiconductor layer 311p to become an active region of a p type TFT for driving circuitry, a semiconductor layer 311t to become an active region of a pixel TFT, a semiconductor layer 311s to become an active region of a retention TFT, and a semiconductor layer 311d to become an active region ($n^+$ type region/ $p^+$ type region, intrinsic region) of a photosensor TFD are formed. The semiconductor layers 311t, 311s, and 311d are disposed in a region of the substrate 301 to become a display region, whereas the semiconductor layers 311n and 311p are disposed outside the region to become the display region.

Figure 7:
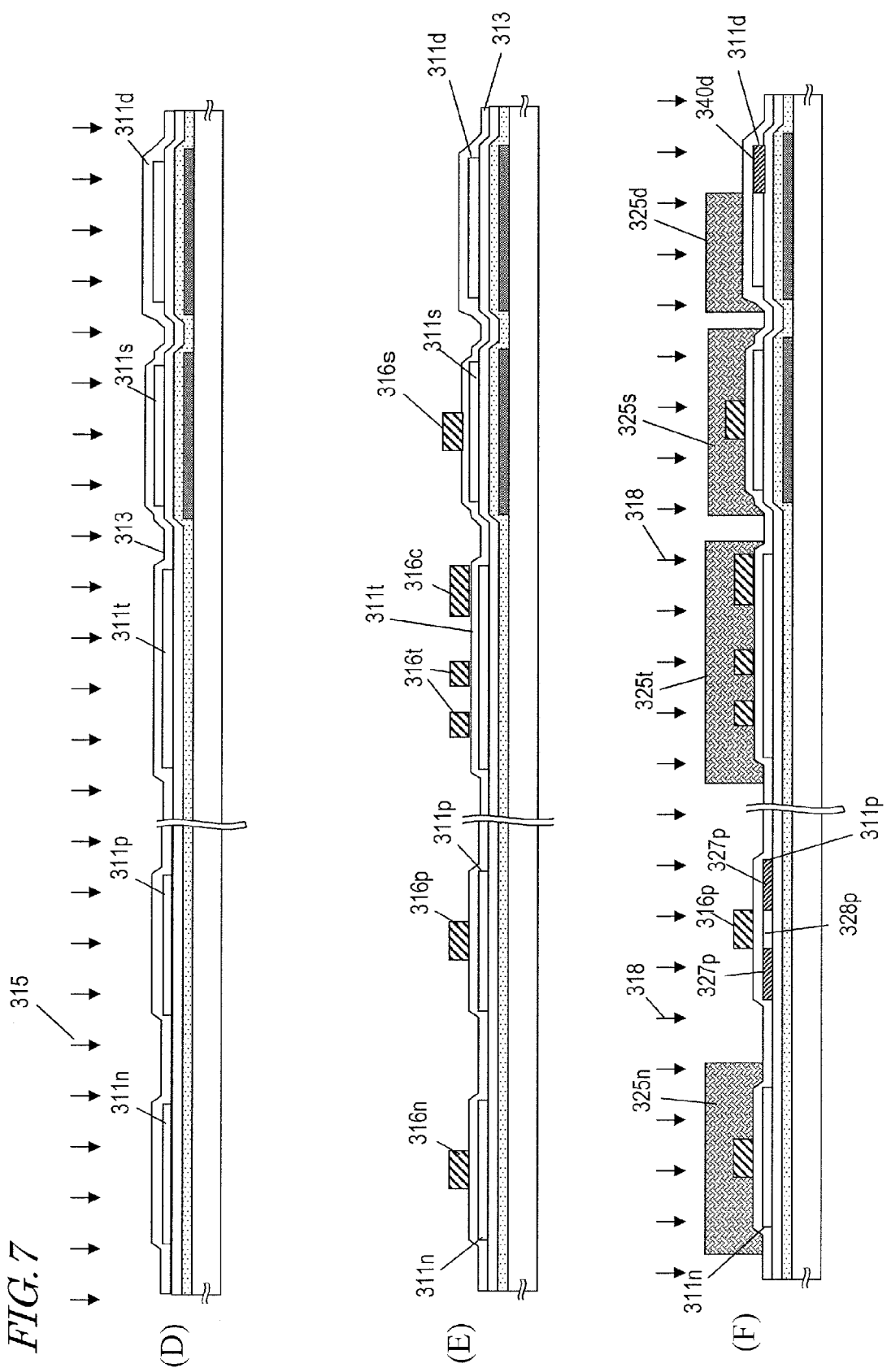
[FIG. 7] (D) to (F) are schematic cross-sectional views showing production steps for a semiconductor device according to a second embodiment of the present invention.

Next, as shown in FIG. 7(D), a gate insulating film 313 covering the semiconductor layers 311n, 311p, 311t, 311s, and 311d is formed. As the gate insulating film 313, a silicon oxide film or a silicon nitride film may be formed by CVD technique, for example. In the case of forming a silicon oxide film, a plasma CVD technique may be performed by using $SiH_4$ and $N_2O$ (or $O_2$) as the source gas. The gate insulating film 313 may be single-layered, or have a multilayer structure. The gate insulating film 313 has a thickness of no less than 10 nm and no more than 120 nm, for example.

Then, in order to adjust the dose in each semiconductor layer, an ion implantation of a p type impurity 315 such as boron (B) or indium (In) is conducted for each semiconductor layer. In the present embodiment, an ion implantation is performed by setting the implantation energy at no less than 10 KeV and no more than 80 KeV, and the dose at no less than $5 \times 10^{11}$ (ions/cm$^2$) and no more than $5 \times 10^{12}$ (ions/cm$^2$), for example. Preferably, the concentration of the p type impurity in these semiconductor layers after implantation is no less than $5 \times 10^{16}$ (atoms/cm$^3$) and no more than $5 \times 10^{17}$ (atoms/cm$^3$).

In the present embodiment, the implanted amounts of p type impurity 315 in the semiconductor layers 311n, 311p, 311t, 311s, and 311d are made different in the above implantation step. For example, by using different implantation masks (resist masks), plural steps of ion implantation may be conducted under different implantation conditions. Alternatively, a gray-tone mask may be formed, and by conducting ion implantation via this, the implanted amount in each semiconductor layer can be made different.

When a p type impurity is implanted to the semiconductor layers 311n, 311t, and 311s of the n type TFTs (channel doping), their current-voltage curves can be shifted toward higher voltages. Therefore, it is possible to adjust the drain current Id so that it takes a smallest value (OFF state) when the gate voltage Vg=0. However, since the threshold voltage also is shifted toward higher voltages, the p type impurity concentration is to be adjusted so that the desired OFF characteristics and ON characteristics are obtained for each TFT. In the case where a light shielding layer with a fixed potential is provided below each TFT, its potential is also taken into consideration in optimizing the p type impurity concentration (FIG. 3). Note that the p type impurity does not need to be implanted to the semiconductor layer 311p of the p type TFT and the semiconductor layer 311d of the photosensor TFD.

For example, the boron dose of the semiconductor layer 311s to become the retention TFT may be no less than $2 \times 10^{12}$/cm$^2$ and no more than $4 \times 10^{12}$/cm$^2$, and the boron dose of the semiconductor layer 311t to become the pixel TFT may be $3.8 \times 10^{12}$/cm$^2$. The impurity concentration (boron concentration) of the channel region of the retention TFT produced by this method will be no less than $2 \times 10^{17}$/cm$^3$ and no more than $4 \times 10^{17}$/cm$^3$, and the impurity concentration (boron concentration) of the channel region of the pixel TFT will be $3.8 \times 10^{17}$/cm$^3$.

Next, as shown in FIG. 7(E), on the gate insulating film 313, gate electrodes 316n, 316p, 316t, and 316s are formed so as to partially overlap the semiconductor layers 311n, 311p, 311t, and 311s of the TFTs, respectively. Moreover, an upper electrode 316c of a storage capacitor is formed on the semiconductor layer 311t.

In the example shown in the figure, two gate electrodes 316t are formed on the semiconductor layer 311t of the pixel TFT (double-gate structure), whereas one gate electrode is formed in the semiconductor layer of any other TFT; however, the gate structure of each TFT is not limited thereto. Two or three gate electrodes may be formed on the semiconductor layer 311s of the retention TFT to obtain a double-gate structure or a triple-gate structure.

The gate electrodes 316n, 316p, 316t, and 316s are formed by depositing a conductive film on the gate insulating film 313 by sputtering technique or vacuum deposition technique, and patterning this. Preferably, the conductive film is a metal film whose main component is W, Ta, Ti, Mo, Al, or other elements. The conductive film has a thickness of no less than 200 nm and no more than 600 nm, for example.

Next, as shown in FIG. 7(F), a p type impurity 318 is ion-implanted to portions of the semiconductor layer 311p of the p type TFT for driving circuitry and the semiconductor layer 311d of the photosensor TFD, thereby forming p type diffusion layers.

Specifically, first, resist masks 325n, 325t, 325s, and 325d covering the entire semiconductor layers 311n, 311t, and 311s and regions of the semiconductor layer 311d to become an n type region (n layer) and an intrinsic region (i layer) are formed. Next, the p type impurity 318, e.g., boron (B) or indium (In), is ion-implanted. As a result, the p type impurity 318 is implanted to regions of the semiconductor layer 311p that are not covered by the gate electrode 316p, which become source/drain regions 327p. The region of the semiconductor layer 311p which is overlapped by the gate electrode 316p and to which the p type impurity 318 has not been implanted becomes a channel region 328p. Moreover, the p type impurity 318 is implanted to the region of the semiconductor layer 311d that is not covered by the resist mask 325d, which becomes a p type region 340d. After the ion implantation, the resist masks 325n, 325t, 325s, and 325d are removed.

There is no particular limitation as to the implantation conditions of this step. For example, the ion implantation may be performed by setting the implantation energy at no less than 10 KeV and no more than 80 KeV, and the dose at no less than $5 \times 10^{14}$(ion/cm$^{-2}$) and no more than $2 \times 10^{16}$(ion/cm$^{-2}$). Preferably, the p type impurity concentrations of the source/drain regions 327p and the p type region 340d are no less than $1.5 \times 10^{20}$(ions/cm$^3$) and no more than $3 \times 10^{21}$ (ions/cm$^3$).

Figure 8:
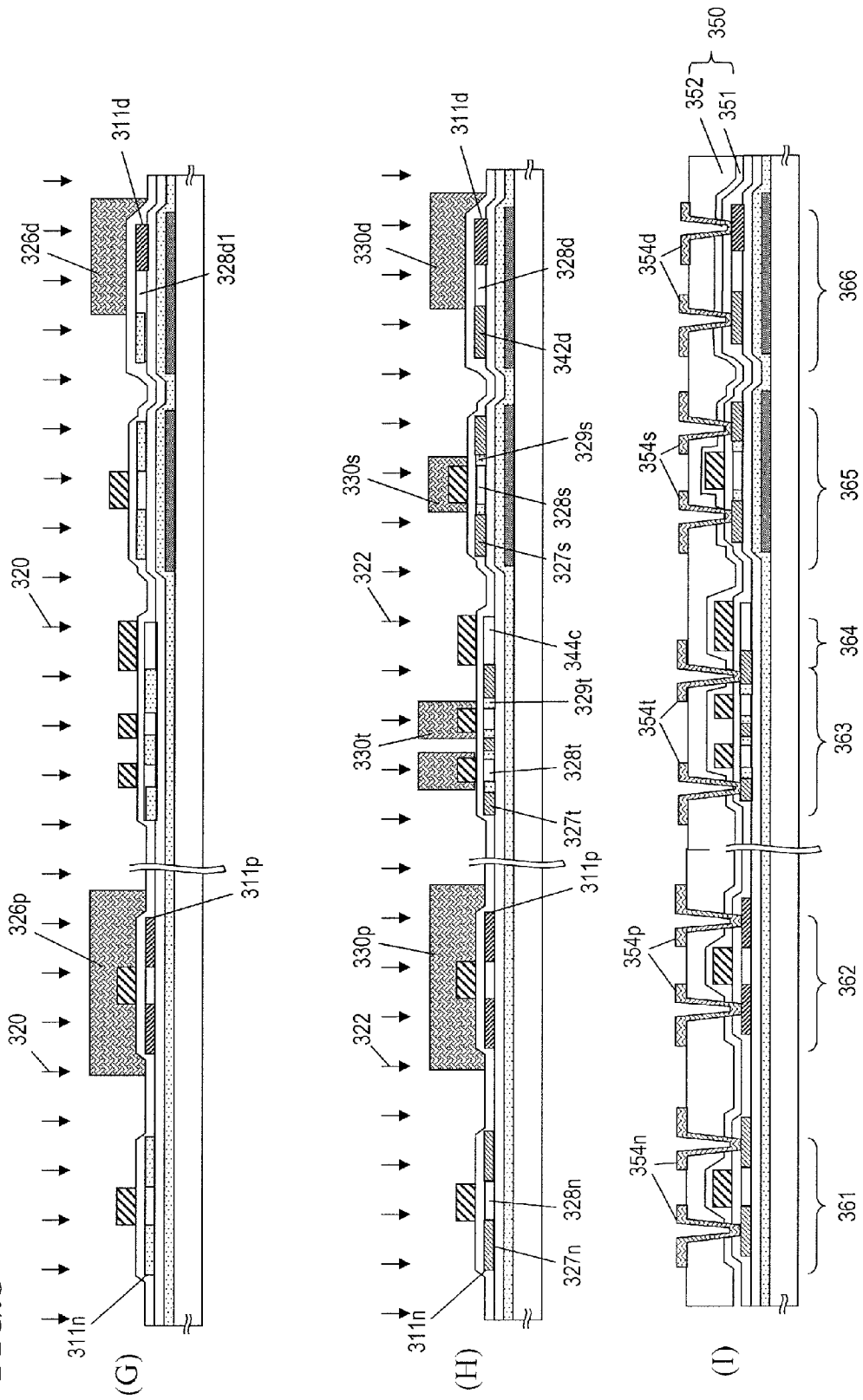
[FIG. 8] (G) to (I) are schematic cross-sectional views showing production steps for a semiconductor device according to a second embodiment of the present invention.

Next, as shown in FIG. 8(G), an n type impurity 320 is implanted to portions of the semiconductor layer 311n of the n type TFT for driving circuitry, the semiconductor layer 311t of the pixel TFT, the semiconductor layer 311s of the retention TFT, and the semiconductor layer 311d of the photosensor TFD, thus forming n type diffusion layers.

Specifically, first, resist masks 326p and 326d covering the entire semiconductor layer 311p and regions of the semiconductor layer 311d to become a p type region and an intrinsic region are formed. Next, the n type impurity 320, e.g., phosphorus (P) or arsenic (As), is ion-implanted. As a result, the n type impurity 320 is implanted to the regions of the semiconductor layers 311n, 311t, and 311s that are not covered by the gate electrodes 316n, 316t, and 316s. Moreover, the n type impurity 320 is implanted to the region of the semiconductor layer 311d that is not covered by the resist mask 326d. After the ion implantation, the resist masks 326p and 326d are removed.

There is no particular limitation as to the implantation conditions in this step. For example, the ion implantation may be performed by setting the implantation energy at no less than 10 KeV and no more than 100 KeV, and the dose at no less than $1 \times 10^{12}$ (ions/cm$^2$) and no more than $1 \times 10^{14}$ (ions/cm$^2$). Preferably, the n type impurity concentration in the n type diffusion layer is no less than $1 \times 10^{17}$(ions/cm$^3$) and no more than $1 \times 10^{19}$(ions/cm$^3$).

Thereafter, as shown in FIG. 8(H), the n type impurity 322 is further implanted to the semiconductor layer 311n of the n type TFT for driving circuitry, the semiconductor layer 311t of the pixel TFT, and the regions to become the source/drain regions of the semiconductor layer 311s of the retention TFT, as well as the region to become the n type region of the semiconductor layer 311d of the photosensor TFD, thereby forming high-concentration n type regions.

Specifically, first, resist masks 330p, 330t, 330s, and 330d covering the entire semiconductor layer 311p, the regions to become the LDD regions of the semiconductor layers 311t and 311s, and the regions to become a p type region and an intrinsic region of the semiconductor layer 311d are formed. Next, the n type impurity 322, e.g., phosphorus (P) or arsenic (As), is ion-implanted. As a result, the n type impurity 322 is implanted to the regions of the semiconductor layer 311n that are not covered by the gate electrode 316n, which become source/drain regions 327n. The region of the semiconductor layer 311n which is overlapped by the gate electrode 316n and to which the p type impurity 320, 322 has not been implanted becomes a channel region 328n. Moreover, the n type impurity 322 is implanted to the regions of the semiconductor layers 311t and 311s that are covered by neither the resist masks 330t and 330s nor the gate electrodes 316t and 316s, and these regions respectively become source/drain regions 327t and 327s. The regions of the semiconductor layers 311t and 311s that are not covered by the gate electrodes 316t and 316s, but which are covered by the resist masks 330s and 330t and to which the n type impurity 322 has not been implanted, become LDD regions 329t and 329s. The regions of the semiconductor layers 311t and 311s which are overlapped by the gate electrodes 316t and 316s and to which neither n type impurity 320, 322 has been implanted become channel regions 328t and 328s. The portion of the semiconductor layer 311t which is overlapped by the upper electrode 316c becomes a lower electrode 344c of the storage capacitor. Furthermore, the n type impurity 322 is implanted to the region of the semiconductor layer 311d that is not covered by the resist mask 330d, thus forming an n type region 342d. The portion of the semiconductor layer 311d to which neither the n type impurity 320, 322 nor the p type impurity 318 has been implanted becomes an intrinsic region 328d. After the ion implantation, the resist masks 330p, 330t, 330s, and 330d are removed.

There is no particular limitation as to the implantation conditions in this step. For example, the ion implantation is performed by setting the implantation energy at no less than 10 KeV and no more than 100 KeV, and the dose at no less than $5 \times 10^{14}$ (ions/cm$^2$) and no more than $1 \times 10^{16}$ (ions/cm$^2$). Preferably, the n type impurity concentration in the n type diffusion layer is no less than $1.5 \times 10^{20}$(ions/cm$^3$) and no more than $3 \times 10^{21}$ (ions/cm$^3$).

According to the process shown in the figures, the LDD regions 329t of the pixel TFT and the LDD regions 329s of the retention TFT have the same impurity concentration; however, their impurity concentrations may be different. For example, the ion implantation step (FIG. 8(G)) for forming the LDD regions may be separated into two, so that an ion implantation step for forming the LDD regions of the pixel TFT and an ion implantation step for forming the LDD regions of the retention TFT are performed, where the implantation conditions of the respective steps may be made different. Alternatively, in the ion implantation step shown in FIG. 8(G), the implanted amounts in the semiconductor layers 311t and 311s may be made different by using a gray-tone mask.

Although there is no particular limitation as to the n type impurity concentration of each LDD region, the OFF-leakage current can be further reduced when the resistance of the LDD regions increases by decreasing a n type impurity concentration, as will be described later. However, when the LDD regions increase in resistance, the ON current will also decrease. Therefore, the n type impurity concentration in each LDD region is preferably optimized in accordance with the ON characteristics and OFF characteristics required of the respective TFT.

Thereafter, a heat treatment for activating the p type and n type impurities which have been implanted to the respective semiconductor layers is performed.

Next, as shown in FIG. 8(I), an interlayer insulating film 350 is formed. When forming a silicon oxide film as the interlayer insulating film 350, a plasma CVD technique may be performed by using SiH$_4$ and N$_2$O (or O$_2$) as the source gas. The interlayer insulating film 350 may be single-layered, or have a multilayer structure. Herein, as the interlayer insulating film 350, the silicon nitride film 351 and the silicon oxide film 352 are formed in this order. If necessary, a heat treatment for hydrogenation may be performed.

Thereafter, in the interlayer insulating film 350, contact holes reaching the source/drain regions of each TFT and the p type region and n type region of the TFD are formed. Then, a conductive film is deposited on the interlayer insulating film 350 and in the contact holes, and is patterned. As a result, electrodes/wiring 354n, 354p, 354t, and 354s of the TFTs and electrodes/wiring 354d of the TFD are obtained. As the conductive film, it is preferable to use a metal film whose main component is Ta, Ti, W, Mo, Al or other elements. Formation of the conductive film can be performed by sputtering technique, vacuum deposition technique, or the like. Moreover, the conductive film may be single-layered, or have a multi-layer structure.

In this manner, an n type TFT 361 for driving circuitry, a p type TFT 362 for driving circuitry, a pixel TFT 363, a storage capacitor 364, a retention TFT 365, and a photosensor TFD 366 are obtained.

Although not shown, a planarization film may be provided on these TFTs and TFD. In the planarization film, an opening needs to be formed for allowing a subsequently-formed pixel electrode and the pixel TFT to be electrically connected. The material of the planarization film may be a photosensitive resin. In this case, an opening can be formed above the pixel TFT through photolithography. Next, a pixel electrode is formed on the planarization film. Preferably, a transparent electrically conductive material (e.g., ITO, IZO) which transmits light from the backlight is used as the material of the pixel electrode.

The production method for the semiconductor device of the present embodiment is not limited to the above-described method. Although a TFT of a single drain structure is formed as the driving circuit TFT in the above-described method, a TFT of a GOLD (Gate Overlapped LDD) structure may instead be formed. A "GOLD structure" is a structure in which LDD regions are overlapped by a gate electrode, for example. In a TFT having a GOLD structure, when a voltage is applied to the gate electrode, electrons to serve as carriers are stored in the LDD regions being overlapped by the gate electrode. Thus, the resistance of the LDD regions can be kept small, thereby preventing lowering of the drive current of the TFT. Note that a TFT of a GOLD structure has a disadvantage of a larger OFF-leakage current than that of a TFT of the aforementioned LDD structure (i.e., a structure where the gate electrode and the LDD regions do not overlap), and thus is not suitably used as the pixel TFT and the retention TFT.

Although the above-described method specifically illustrates a crystallization method using a catalyst element, crystallization may be effected by subjecting an amorphous semiconductor film to laser irradiation (laser crystallization).

However, use of a catalyst element for crystallizing an amorphous semiconductor film is preferable because the crystallized semiconductor film will have a higher crystallinity than that of a semiconductor film which has been crystallized by any other method (e.g., laser crystallization). When a TFT is formed by using a highly crystalline semiconductor layer, the rise characteristics when turning ON the TFT (subthreshold characteristics) can be improved. In other words, changes in the drain current with respect to the gate-source voltage can be made steeper near the threshold voltage.

A semiconductor layer that is made of a semiconductor film which has been crystallized by using a catalyst element contains the catalyst element. Moreover, at least the channel region of the semiconductor layer will be mainly composed of a region with the <111> zone of the crystal. The reasons thereof will be described below.

Generally speaking, when an amorphous semiconductor film is crystallized without using a catalyst element, the plane orientation of the crystalline semiconductor film is likely to be (111), due to the influence of an underlying insulator of the semiconductor film (particularly in the case of an amorphous silicon dioxide). On the other hand, when crystallization is performed by adding a catalyst element to an amorphous semiconductor film, as in the above-described method, a semiconductor compound of the catalyst element provides a driving force of crystal growth, so that crystallization occurs sequentially in one direction through adjacent amorphous regions. Since the catalyst element compound has a nature of growing intensively in the <111> direction, the <111> zone appears.

Moreover, according to the above-described method, 50% or more of the region of the semiconductor layer with the <111> zone is a region having the (110) plane or the (211) plane. Furthermore, individual crystal domains (which are regions having substantially the same plane orientation) have sizes (domain diameters) of no less than 2 μm and no more than 10 μm, for example. The plane orientations and ratios of the plane orientations, and the domain diameters of the crystal domains, are values obtained through EBSP measurement.

A semiconductor device according to the present invention is not limited to a display device having photosensor sections, but may be an image sensor.

Hereinafter, the construction of an image sensor to which the present invention is applied will be briefly described.

The image sensor includes a plurality of photodetecting portions which are arranged in a two-dimensional array, and an image information generation section which generates image information. Each photodetecting portion may have a similar construction to that of a pixel shown in FIG. 1(A). Alternatively, it may be composed of three pixels (RGB pixels). Each photodetecting portion includes a photosensor section as discussed above. The image information generation section generates image information which is associated with a sensing signal that is generated by the photosensor section of each photodetecting portion and the position of each photodetecting portion. As a result, an image as read by the image sensor can be formed or recognized for authentication.

Although the first and second embodiments illustrate examples of employing the photosensor section 200 shown in FIG. 1, the photosensor section construction according to the present invention is not limited to the construction shown in FIG. 1. For example, a plurality of photosensor TFDs may be connected in parallel for an enhanced output.

Figure 9:
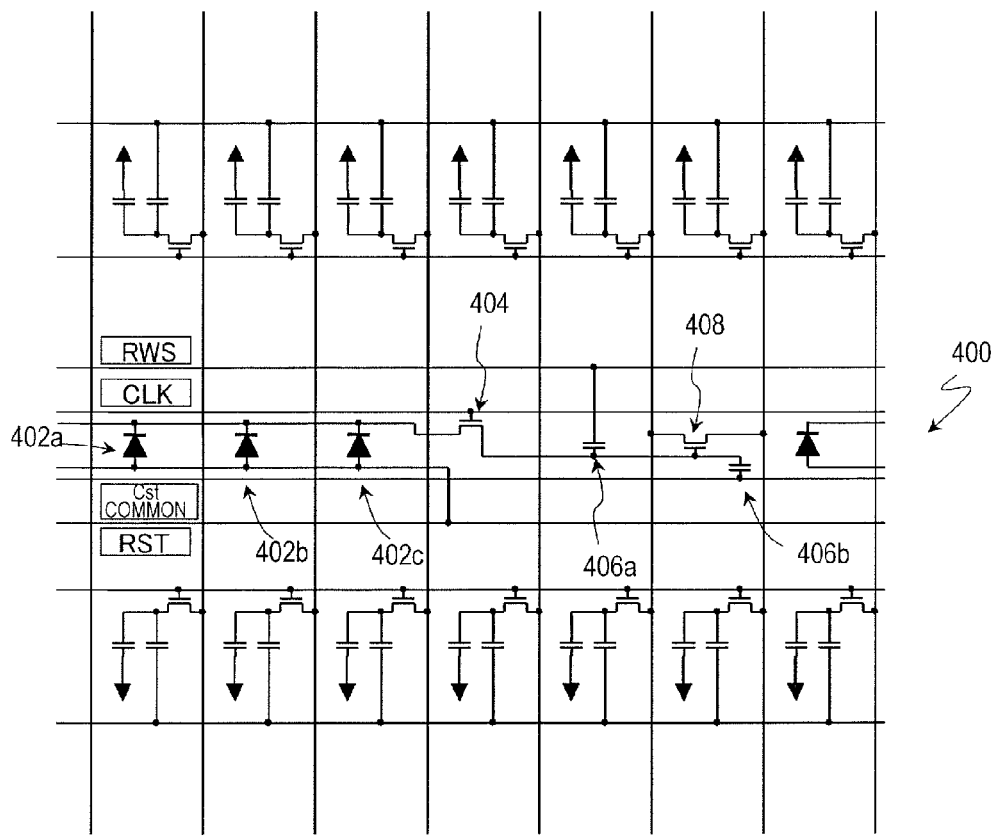
[FIG. 9] A diagram showing the construction of another active matrix substrate according to an embodiment of the present invention.

FIG. 9 is a diagram showing an example active matrix substrate having a photosensor section 400 which includes a plurality of photosensors.

The photosensor section 400 includes photosensor TFDs 402a, 402b, and 402c which are connected in parallel, a retention TFT 404, capacitors 406a and 406b, and a buffer TFT 408. Because of employing three photosensor TFDs, the photosensor section 400 is able to generate a larger photocurrent, whereby deteriorations in the sensing characteristics due to OFF leakage of the retention TFT can be suppressed. In this example, one photosensor section 400 is provided for twelve pixels, i.e., four color pixels.

Moreover, as described earlier, the retention TFT of the present embodiment may have a multi-gate structure including a plurality of gate electrodes.

Figure 10:
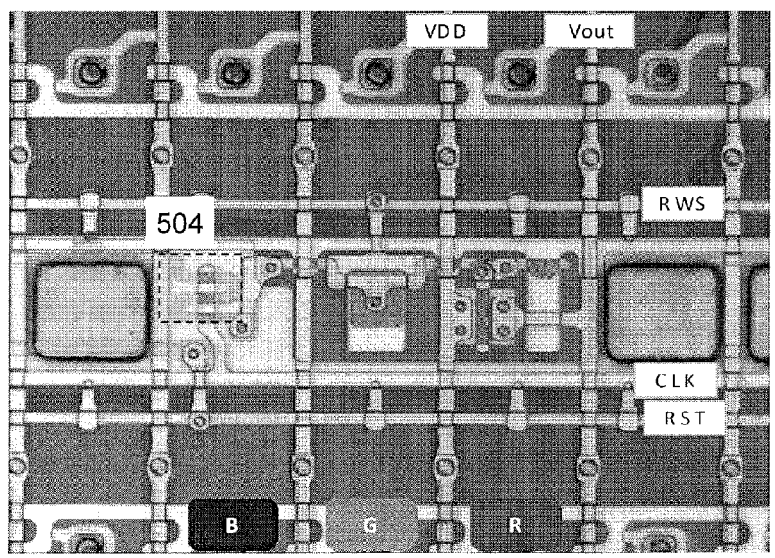
[FIG. 10] A plan view showing the construction of another active matrix substrate according to an embodiment of the present invention.
Figure 11:
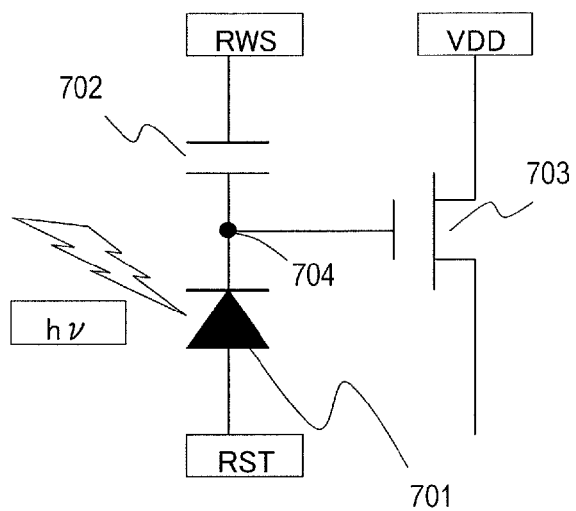
[FIG. 11] A circuit diagram showing the construction of a conventional photosensor section.

FIG. 10 is a plan view showing a portion of the active matrix substrate having a retention TFT with a triple-gate structure. In the retention TFT 504, a meandering gate electrode (gate line) overlaps the semiconductor layer at three places, thus forming three channel regions in the semiconductor layer. With this construction, the OFF-leakage current can be reduced more effectively.

Thus, according to the present embodiment, a pixel TFT, a retention TFT, and a driving circuit TFT can be optimized in accordance with their respective applications and requirements, thus realizing desired device characteristics. Therefore, while enhancing the sensor sensitivity of the photosensor sections, a higher-quality displaying can be realized.

Moreover, according to the production method of the present embodiment, the aforementioned display device can be produced through a process which entails low cost and a small number of steps. In particular, the production steps can be simplified by conducting a doping step for forming the source and drain regions of the pixel TFT, the retention TFT, and the driving circuit TFT simultaneously with a doping step for forming the n type or p type region of the photosensor TFD, as in the above-described method.

Industrial Applicability

The present invention is broadly applicable to semiconductor devices including photosensor sections having photosensor TFDs, or electronic appliances in any field that have such semiconductor devices. For example, the present invention may be applied to active matrix type liquid crystal display devices or organic EL display devices. Such display devices are applicable to the display screens of mobile phones and portable game machines, monitors of digital cameras, and the like, for example. Therefore, the present invention is applicable to any and all electronic appliances in which liquid crystal display devices or organic EL display devices are incorporated.

In particular, the present invention is applicable to display devices such as active matrix type liquid crystal display devices and organic EL display devices, image sensors, photosensors, or electronic appliances combining them. The present invention may particularly advantageously be applied to display devices having a photosensor function utilizing TFDs, or electronic appliances having such display devices. It is also applicable to image sensors having photosensors utilizing TFDs and driving circuits utilizing TFTs.

Reference Signs List
  100 semiconductor device
  102 RST signal line
  104 RWS signal line
  105 pixel TFT
  106 gate bus line
  108 source bus line
  R, G, B (primary color) pixel
  109a, 109b color displaying pixel
  200, 400 photosensor section
  202, 402a, 402b, 402c photosensor TED
  204 retention TFT
  206 storage capacitor
  208 buffer TFT
  209 node
  111 substrate
  149, 159 light shielding layer
  113, 114 underlying film
  119 gate insulating film
  120, 121 interlayer insulating film
  130, 140, 150 semiconductor layer
  131, 141 channel region
  132, 142 LDD region
  133, 143 source/drain region
  135, 145 gate electrode
  137, 147 source/drain electrode
  151 intrinsic region (photodetecting region)
  153 n type region 154 p type region
157 electrode

The invention claimed is:

1. A semiconductor device having a display region including a plurality of pixels, comprising:
   a substrate;
   a first thin film transistor of a first conductivity type formed on the substrate for each pixel; and
   a plurality of photosensor sections formed in the display region on the substrate for detecting light and generating sensing signals, wherein,
   each of the plurality of photosensor sections includes
      a photodetecting portion including at least one thin film diode,
      a capacitor for storing a photocurrent occurring in the at least one thin film diode, and
      a second thin film transistor of the first conductivity type disposed between the photodetecting portion and the capacitor, the photodetecting portion being connected to the capacitor via the second thin film transistor;
   the first and second thin film transistors and the at least one thin film diode have semiconductor layers made of a same semiconductor film;
   the semiconductor layers of the first and second thin film transistors each include source and drain regions and a channel region located between the regions; and
   a characteristic of the first thin film transistor and a characteristic of the second thin film transistor are different.

2. The semiconductor device of claim 1, wherein a threshold voltage of the first thin film transistor is different from a threshold voltage of the second thin film transistor.

3. The semiconductor device of claim 1, wherein,
   the channel regions of the first and second thin film transistors each contain an impurity of a second conductivity type different from the first conductivity type; and
   the impurity of the second conductivity type has respectively different concentrations in the channel regions of the first and second thin film transistors.

4. The semiconductor device of claims 1, wherein an OFF-leakage current of the first thin film transistor is different from an OFF-leakage current of the second thin film transistor.

5. The semiconductor device of claim 4, wherein an OFF-leakage current of the second thin film transistor is smaller than an OFF-leakage current of the first thin film transistor.

6. The semiconductor device of claims 1, wherein the second thin film transistor includes low-concentration impurity regions formed between the source and drain regions and the channel region, the low-concentration impurity regions containing an impurity of the first conductivity type at a lower concentration than in the source and drain regions, the low-concentration impurity regions not overlapping a gate electrode.

7. The semiconductor device of claim 6, wherein,
   the first thin film transistor includes low-concentration impurity regions formed between the source and drain regions and the channel region, the low-concentration impurity regions containing an impurity of the first conductivity type at a lower concentration than in the source and drain regions, the low-concentration impurity regions not overlapping a gate electrode; and
   the impurity of the first conductivity type has respectively different concentrations in the low-concentration impurity regions of the first and second thin film transistors.

8. The semiconductor device of claims 1, wherein the second thin film transistor has a multi-gate structure.

9. The semiconductor device of claim 8, wherein the second thin film transistor has a triple-gate structure.

10. The semiconductor device of claims 1, wherein, between the semiconductor layer of the second thin film transistor and the substrate, a light shielding layer is formed so as to overlap at least the channel region of the semiconductor layer of the second thin film transistor.

11. The semiconductor device of claim 10, wherein the light shielding layer has a fixed potential.

12. The semiconductor device of claim 10, wherein a sensor light shielding layer is disposed between the semiconductor layer of the at least one thin film diode and the substrate, the sensor light shielding layer and the light shielding layer being electrically connected.

13. The semiconductor device of claim 1, wherein the semiconductor layer of the thin film diode includes a p type region, an n type region, and an intrinsic region located between the p type region and the n type region.

14. The semiconductor device of claim 1, wherein the first conductivity type is n, and the second conductivity type is p.

15. The semiconductor device of claim 1,
   further comprising another thin film transistor formed in a region other than the display region on the substrate, wherein,
   the other thin film transistor has a semiconductor layer being made of the same semiconductor film and having source and drain regions and a channel region; and
   a characteristic of the other thin film transistor is different from a characteristic of the second thin film transistor.

16. The semiconductor device of claim 15, wherein the impurity of the second conductivity type has respectively different concentrations in the channel regions of the other thin film transistor and the second thin film transistor.

17. The semiconductor device of claim 1, further comprising a backlight for emitting visible light and infrared light, wherein
   the thin film diode is capable of detecting the infrared light.

18. The semiconductor device of claim 1, wherein the photosensor section is disposed corresponding to each pixel or set of two or more pixels.

19. A semiconductor device comprising:
   a substrate;
   a plurality of first thin film transistors of a first conductivity type formed on the substrate; and
   a plurality of photosensor sections formed on the substrate for detecting light and generating sensing signals, wherein,
   each of the plurality of photosensor sections includes
      a photodetecting portion including at least one thin film diode,
      a capacitor for storing a photocurrent occurring in the at least one thin film diode, and
      a second thin film transistor of the first conductivity type disposed between the photodetecting portion and the capacitor, the photodetecting portion being connected to the capacitor via the second thin film transistor;
   the first and second thin film transistors and the at least one thin film diode have semiconductor layers made of a same semiconductor film;
   the semiconductor layers of the first and second thin film transistors each include source and drain regions and a channel region located between the regions; and
   a characteristic of the first thin film transistor and a characteristic of the second thin film transistor are different.

* * * * *